US011095256B2

(12) United States Patent
Seshita et al.

(10) Patent No.: US 11,095,256 B2
(45) Date of Patent: Aug. 17, 2021

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventors: Toshiki Seshita, Kawasaki Kanagawa (JP); Yasuhiko Kuriyama, Yokohama Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 45 days.

(21) Appl. No.: 16/298,157

(22) Filed: Mar. 11, 2019

(65) Prior Publication Data
US 2019/0372534 A1    Dec. 5, 2019

(30) Foreign Application Priority Data

May 29, 2018 (JP) .............................. JP2018-102583

(51) Int. Cl.
*H03F 3/04* (2006.01)
*H03F 3/193* (2006.01)
*H03F 1/02* (2006.01)
*H03F 3/72* (2006.01)

(52) U.S. Cl.
CPC .......... *H03F 3/193* (2013.01); *H03F 1/0211* (2013.01); *H03F 3/72* (2013.01); *H03F 2200/372* (2013.01)

(58) Field of Classification Search
CPC .......... H03F 3/193; H03F 1/0211; H03F 3/72; H03F 2200/372; H03F 2200/451; H03F 2200/489; H03F 2200/294; H03F 3/68

USPC .......................... 330/51, 251, 277, 296, 311
See application file for complete search history.

(56) References Cited

U.S. PATENT DOCUMENTS

| 8,975,968 | B2 | 3/2015 | Abdelhalem et al. |
| 9,035,697 | B2 | 5/2015 | Youssef et al. |
| 9,154,356 | B2 | 10/2015 | Tasic et al. |
| 2013/0315348 | A1 | 11/2013 | Tasic et al. |
| 2014/0210554 | A1 | 7/2014 | Abdelhalem et al. |
| 2014/0266461 | A1 | 9/2014 | Youssef et al. |

FOREIGN PATENT DOCUMENTS

| JP | 2006-14241 A | 1/2006 |
| JP | 2013-247469 A | 12/2013 |
| JP | 2015-521010 A | 7/2015 |

(Continued)

*Primary Examiner* — Khanh V Nguyen
*Assistant Examiner* — Khiem D Nguyen
(74) *Attorney, Agent, or Firm* — White & Case LLP

(57) ABSTRACT

A semiconductor device includes three transistors, five switches, two inductors, and a capacitor. A first transistor has a gate. The switches have one terminal connected in series with a drain of the first transistor in parallel. A second transistor has a source connected to the first switch and a grounded gate. A third transistor having a source connected to the second switch and a grounded gate. A first inductor and a second inductor each has one terminal connected in series with the third switch in parallel. A fourth switch has one terminal connected to the first inductor and another terminal connected to the source of the second transistor. A fifth switch has one terminal connected to the second inductor and another terminal connected to the source of the third transistor. A capacitor connected between the one terminal of the fourth switch and the one terminal of the fifth switch.

18 Claims, 34 Drawing Sheets

(56) References Cited

FOREIGN PATENT DOCUMENTS

| | | |
|---|---|---|
| JP | 2016-504894 A | 2/2016 |
| JP | 5882554 B2 | 3/2016 |
| JP | 5908663 B1 | 4/2016 |
| JP | 2016-514439 A | 5/2016 |
| JP | 5982259 B2 | 8/2016 |

| OUTPUT MODE | BY-PASS MODE | ACTIVE OUTPUT | Sw20 | Sw21 | Sw22 | Sw23 | Sw24 | Sw25 | Sw26 | Sw27 | Sw28 | Sw29 |
|---|---|---|---|---|---|---|---|---|---|---|---|---|
| SINGLE OUTPUT | OFF | Pt1 | ON | OFF | OFF | ON | ON | OFF | OFF | ON | OFF | OFF |
| | | Pt2 | ON | OFF | OFF | ON | OFF | ON | ON | OFF | OFF | OFF |
| SPLIT OUTPUT | | Pt1,Pt2 | ON | OFF | OFF | ON | ON | OFF | ON | OFF | OFF | OFF |
| SINGLE OUTPUT | ON | Pt1 | OFF | ON | ON | OFF | OFF | ON | OFF | ON | ON | OFF |
| | | Pt2 | OFF | ON | ON | OFF | OFF | ON | OFF | ON | OFF | ON |

FIG. 2

| OUTPUT MODE | OUTPUT TERMINAL | Cont1 | Cont2 | Cont3 | Cont4 | Cont5 |
|---|---|---|---|---|---|---|
| SINGLE OUTPUT | LNA_OUT1 | High | Low | Low | Low | High |
| | LNA_OUT2 | Low | High | Low | High | Low |
| SPLIT OUTPUT | LNA_OUT1, LNA_OUT2 | Low | Low | High | Low | Low |

FIG. 4

| OUTPUT MODE | OUTPUT TERMINAL | Cont1 | Cont2 | Cont3 | Cont4 | Cont5 | Cont6 |
|---|---|---|---|---|---|---|---|
| SINGLE OUTPUT | LNA_OUT1 | High | Low | Low | Low | High | High |
| | LNA_OUT2 | Low | High | Low | High | Low | High |
| SPLIT OUTPUT | LNA_OUT1, LNA_OUT2 | Low | Low | High | Low | Low | Low |

FIG. 18

| MODE | BIAS CURRENT (mA) | S21 (dB) fcenter | NF (dB) fcenter | S11 (dB) within band | S22 (dB) within band | S23 (dB) within band | IIP3 (dBm) fcenter | IP1dB (dBm) fcenter |
|---|---|---|---|---|---|---|---|---|
| SINGLE OUTPUT | 6.17 | 18.3 | 0.73 | -11.8 | -14.1 | -46.4 | -1.1 | -13.1 |
| SPLIT OUTPUT | 12.20 | 17.1 | 0.92 | -12.0 | -12.1 | -38.4 | 0.4 | -13.7 |

FIG. 28

| MODE | BIAS CURRENT (mA) | S21 (dB) | NF (dB) | S11 (dB) | S22 (dB) | S23 (dB) | IIP3 (dBm) | IP1dB (dBm) |
|---|---|---|---|---|---|---|---|---|
| | | fcenter | fcenter | within band | within band | within band | fcenter | fcenter |
| SINGLE OUTPUT | 6.44 | 18.2 | 0.75 | -10.3 | -14.8 | -46.8 | 2.1 | -12.7 |
| SPLIT OUTPUT | 12.88 | 17.1 | 0.90 | -10.7 | -12.4 | -39.4 | 12.4 | -13.4 |

FIG. 39

| OUTPUT MODE | OUTPUT TERMINAL | Cont1 | Cont2 | Cont3 | Cont4 | Cont5 |
|---|---|---|---|---|---|---|
| SINGLE OUTPUT | LNA_OUT1 | High | Low | Low | Low | High |
| SINGLE OUTPUT | LNA_OUT2 | Low | High | Low | High | Low |
| SPLIT OUTPUT | LNA_OUT1, LNA_OUT2 | High | High | High | Low | Low |

FIG. 41

| OUTPUT MODE | phase (S21) (deg) | |
|---|---|---|
| | 2.496 GHz | 2.69 GHz |
| SINGLE OUTPUT | 93.276 | 57.992 |
| SPLIT OUTPUT | 96.833 | 52.814 |
| PHASE DEVIATION | 3.557 | -5.178 |

FIG. 45

| OUTPUT MODE | OUTPUT TERMINAL | VB1 | VB2 | VB3 | Cont1 | Cont2 | Cont3 | Cont4 | Cont5 | Cont6 |
|---|---|---|---|---|---|---|---|---|---|---|
| SINGLE OUTPUT | LNA_OUT1 | V1a | 1.8V | V3a | High | Low | Low | 0V | 1.8V | High |
| | LNA_OUT2 | V1a | 1.8V | V3a | Low | High | Low | 1.8V | 0V | High |
| SPLIT OUTPUT | LNA_OUT1, LNA_OUT2 | V1b | V2b | V3b | High | High | High | 0V | 0V | Low |

SEMICONDUCTOR DEVICE

CROSS REFERENCE TO RELATED APPLICATIONS

This application is based upon and claims the benefit of priority from the prior Japanese Patent Application No. 2018-102583, filed on May 29, 2018, the entire contents of which are incorporated herein by reference.

FIELD

The embodiments of the present invention relate to a semiconductor device.

BACKGROUND

For a high-frequency low noise amplifier (LNA) used for a cellular phone or the like, a SiGe bipolar process has been conventionally used, and a CMOS (Complementary Metal-Oxide Semiconductor) process by an SOI (Silicon On Insulator) becomes more frequently used. This is because a high functional circuit can be realized by incorporating a high-frequency switch FET (Field Effect Transistor) in the LNA.

BRIEF DESCRIPTION OF THE DRAWINGS

FIG. 2 lists the states of switches of the circuit in FIG. 1;

FIG. 4 lists the voltages to be applied to terminals of the circuit in FIG. 3;

FIG. 18 to FIG. 28 illustrate data regarding the output of the circuit in FIG. 17;

FIG. 31 to FIG. 39 illustrate data regarding the output of the circuit in FIG. 29;

FIG. 41 lists the voltages to be applied to the terminals of the circuit in FIG. 40;

FIG. 42 to FIG. 45 illustrate data regarding the output of the circuit in FIG. 40;

FIG. 47 lists the voltages to be applied to the terminals of the circuit in FIG. 46.

DETAILED DESCRIPTION

According to one embodiment, a semiconductor device includes three transistors, five switches, two inductors, and a capacitor. A first transistor has a gate into which a high-frequency signal is inputted. A first switch, a second switch, and a third switch each has one terminal connected in series with a drain of the first transistor and which are connected in parallel. A second transistor has a source connected to another terminal of the first switch and a gate at which a high-frequency component is grounded. A third transistor has a source connected to another terminal of the second switch and a gate at which a high-frequency component is grounded. A first inductor and a second inductor each has one terminal connected in series with another terminal of the third switch and which are connected in parallel. A fourth switch has one terminal connected to another terminal of the first inductor and another terminal connected to the source of the second transistor. A fifth switch has one terminal connected to another terminal of the second inductor and another terminal connected to the source of the third transistor. A capacitor is connected between the one terminal of the fourth switch and the one terminal of the fifth switch. And when the high-frequency signal is inputted, a signal amplified with low noise is outputted from at least one of a first port connected to a drain of the second transistor and a second port connected to a drain of the third transistor.

Embodiments will now be explained with reference to the accompanying drawings. The present invention is not limited to the embodiments.

Figure 1:
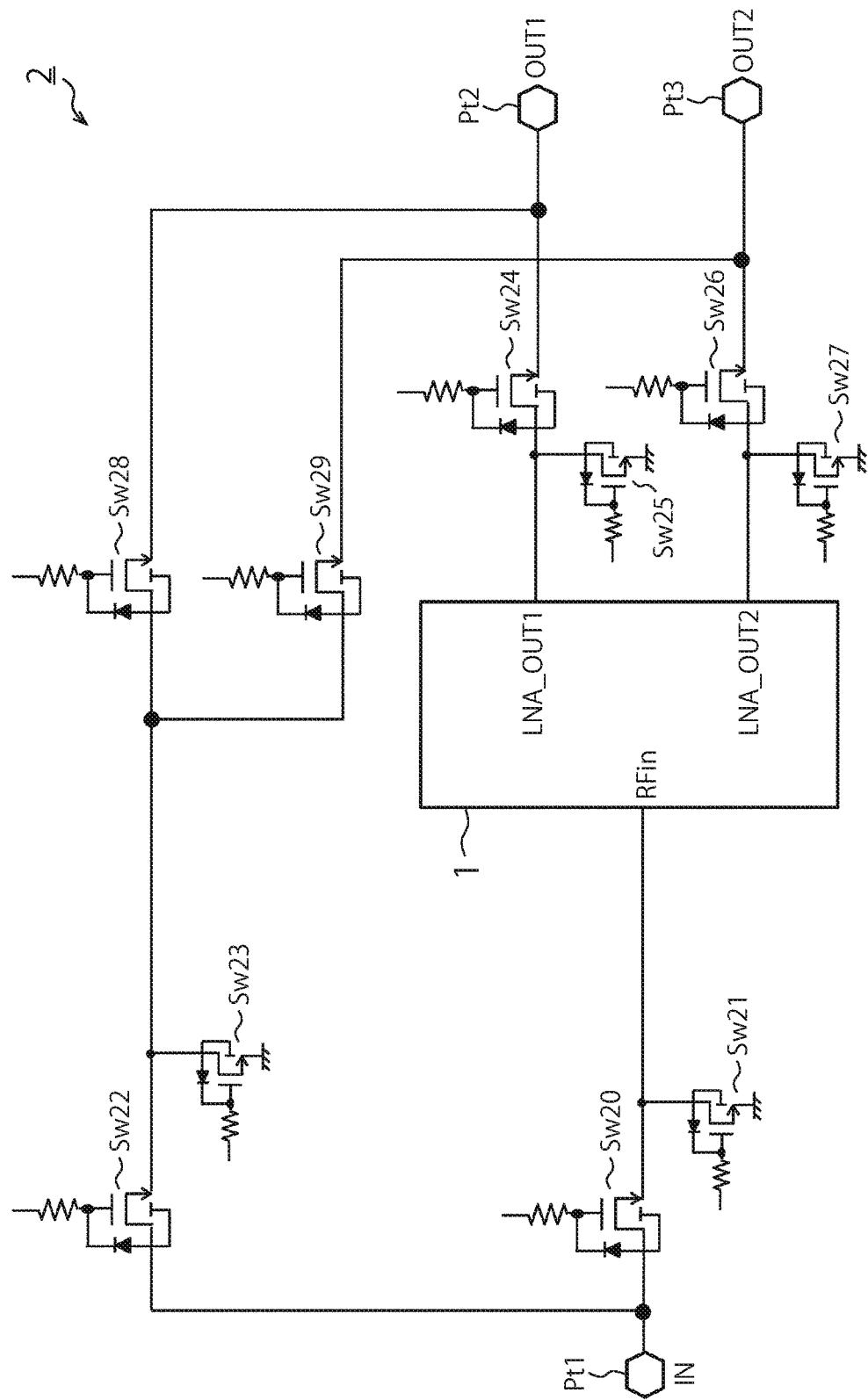
FIG. 1 is a circuit diagram of a circuit including an LNA according to an embodiment.

As illustrated in FIG. 1, an input/output circuit 2 including a semiconductor device 1 includes an input port Pt1 and output ports Pt2, Pt3, as input/output ports. The input/output circuit 2 further includes the semiconductor device 1, and switches Sw20, Sw21, Sw22, Sw23, Sw24, Sw25, Sw26, Sw27, Sw28, Sw29. A signal from the input port Pt1 is split to the output port Pt2 and the output port Pt3 or outputted to one of the output port Pt2 and the output port Pt3.

Each of the switches is, for example, an n-type MOSFET (Metal-Oxide-Semiconductor Field-Effect Transistor) as illustrated, and passes the signal between a drain and a source by application of voltage exceeding a threshold of each MOSFET to a gate. Note that the MOSFET is illustrated as an example, and may be implemented by another transistor such as a bipolar transistor or the like or another switch. This also applies to switches in the following description.

The switch Sw20 and the switch Sw22 are exclusively turned on/off. More specifically, the switch Sw20 and the switch Sw22 are controlled such that when one of them is turned on, the other of them is turned off. When the input/output ports are connected via the semiconductor device 1, the switch Sw20 is turned on and the switch Sw22 is turned off, and when the input/output ports are connected not via the semiconductor device 1, the switch Sw20 is turned off and the switch Sw22 is turned on.

The switch Sw21 is a switch which is connected between the switch Sw20 and a ground point and whose on/off state becomes a reverse state. When the switch Sw20 is turned on, the switch Sw21 is turned off, so that the switch Sw20 and the semiconductor device 1 are connected in series. When the switch Sw20 is turned off, the switch Sw21 is turned on, and the signal passed through an off capacitance of the switch Sw20 is outputted via the switch Sw21 to the ground, so that the switch Sw20 becomes a state of being disconnected from the semiconductor device 1.

In other words, providing the switch Sw21 enables improvement in isolation between both terminals of the switch Sw20 in the off-state. The switches Sw23, Sw25, Sw27 are switches pairing up with the switches Sw22, Sw24, Sw26, respectively, and have the same function as that of the switch Sw21 for the respective switches pairing up therewith.

First, the case where the semiconductor device 1 and the input/output ports are connected will be described. In this case, the switches Sw20, Sw23 are on and the switches Sw21, Sw22 are off. The signal inputted from the input port Pt1 is inputted via the switch Sw20 into the semiconductor device 1.

In the case where the semiconductor device 1 functions as a single output mode, one of the switch Sw24 and the switch Sw26 is turned on and the other is turned off. These switches are turned on/off according to the output port from which the signal is desired to be outputted or according to the output of the semiconductor device 1.

In the case where the semiconductor device 1 functions as a split output mode, both the switch Sw24 and the switch Sw26 are turned on, so that the split signals are outputted to the respective output ports.

In the case where the input/output ports of the input/output circuit 2 are used in a bypass mode not via the semiconductor device 1, the switches are controlled to prevent the semiconductor device 1 and the input/output ports from being directly connected. More specifically, the switches Sw20, Sw24, Sw26 are turned off and the switch Sw22 is turned on instead. By controlling the on/off-states of the switch Sw28 and the switch Sw29 according to the port from which the signal is to be outputted, the signal is outputted from the input port Pt1 to the output port Pt2 or the output port Pt3 not via the semiconductor device 1.

FIG. 2 is a chart listing the on/off-states of the switches in the case where the signal is outputted in each mode in the input/output circuit 2 illustrated in FIG. 1. FIG. 2 is made by summarizing the above-described states of the switches. A bypass mode refers to a mode using the input/output circuit 2 as a bypass without using the semiconductor device 1. A part indicated as an active output indicates the port from which the signal is outputted among the output ports. The states of the switches are controlled as in FIG. 2 depending on whether the signal is outputted via the semiconductor device 1 and on a signal output or a split output.

Hereinafter, each of embodiments of the semiconductor device 1 will be described for each embodiment. In the drawing of the semiconductor device 1 in each embodiment, an input port RFin, an output port LNA_OUT1, and an output port LNA_OUT2 correspond to a port RFin, LNA_OUT1 and LAN_OUT2 in FIG. 1, respectively. Further, all of circuit components illustrated in the following drawings are not always included in the semiconductor device 1 illustrated in FIG. 1 but may be appropriately provided on the periphery of the semiconductor device 1 in FIG. 1. For example, an inductor Lext in following FIG. 3 may be provided outside the semiconductor device 1 in FIG. 1. In this case, a circuit is configured such that the signal inputted from the input port RFin passes through a port that once outputs the signal to the outside of the semiconductor device 1, and is inputted to a port LNAin via the inductor Lext.

First Embodiment

Figure 3:
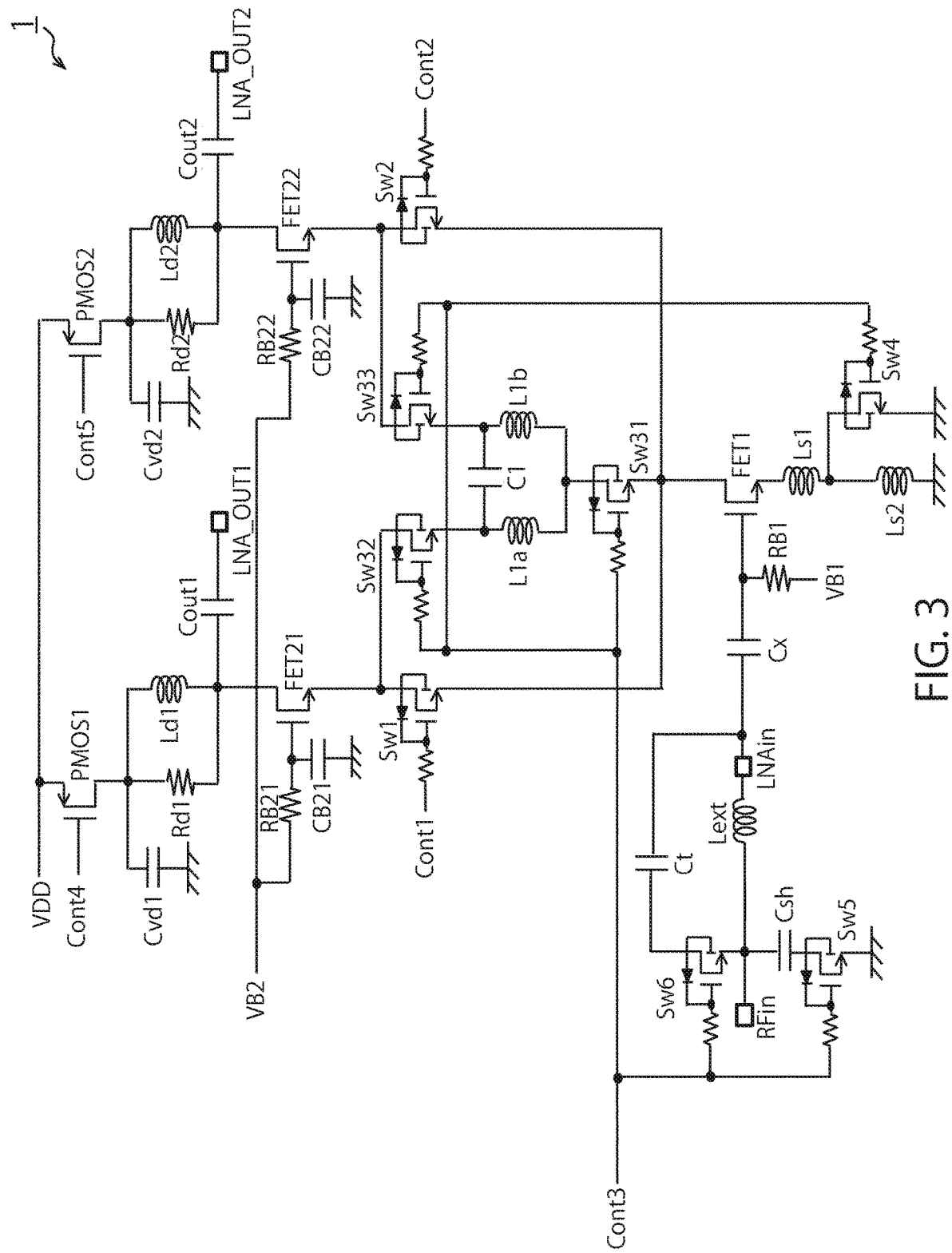
FIG. 3 is a circuit diagram of an LNA according to an embodiment.

FIG. 3 is a circuit diagram illustrating a semiconductor device 1 according to a first embodiment. The semiconductor device 1 is formed, for example, on an SOI substrate. The semiconductor device 1 is a circuit that amplifies, with low noise, a high-frequency signal inputted thereinto.

The semiconductor device 1 includes an input port RFin, output ports LNA_OUT1, LNA_OUT2, switches Sw1, Sw2, Sw31, Sw32, Sw33, Sw4, Sw5, Sw6, n-type MOSFETs FET1, FET21, FET22, p-type MOSFETs PMOS1, PMOS2, inductors Lext, L1a, L1b, Ls1, Ls2, Ld1, Ld2, capacitors Csh, Ct, Cx, C1, CB21, CB22, Cvd1, Cvd2, Cout1, Cout2, and resistors RB1, RB21, RB22, Rd1, Rd2.

Each of the switches includes, for example, n-type MOSFET and is configured as illustrated in the drawing. As one example, as illustrated in the switch Sw1, the switch is configured by connecting the n-type MOSFET, its gate and a resistor in series. Voltage (or current) is applied to another terminal of the resistor that is not a terminal connected to the gate to apply the voltage to the gate, and when the voltage applied to the gate exceeds a predetermined threshold, current flows from the drain to the source. Other switches are also similarly configured, and not only the n-type MOSFET but also, for example, a p-type MOSFET or another switch such as a bipolar or the like may be used.

In the following, that the switch is ON indicates a state where carriers can move (current flows) from the drain to the source of the MOSFET included in the switch, and that the switch is OFF indicates a state where carriers cannot move (current does not flow) between the drain and the source of the MOSFET. However, that carrier cannot move does not strictly mean that there is completely no movement of carriers and does not mean that there is absolutely no leakage current or the like.

When the switch Sw5 is in an on-state, the input port RFin is grounded via the capacitor Csh and connected to the inductor Lext. Hereinafter, the capacitor Csh is called an input-side grounded capacitor Csh. The inductor Lext may be provided as an external inductor Lext that is provided outside the semiconductor device 1. The inductor Lext has, for example, a relatively large inductance such as about 7 nH. The inductor Lext is connected in parallel with the series connection of the switch Sw6 and the capacitor Ct. In a state where the switch Sw6 is in an on-state, the capacitor Ct causes the inductor Lext to resonate to thereby enhance the apparent inductance. Hereinafter, the capacitor Ct is called an input-side resonant capacitor. Based on the above, the input-side resonant capacitor Ct is not an essential component but may be omitted.

The inductor Lext is connected to the gate of a first MOSFET FET1 via the input-side resonant capacitor Ct that functions as an input capacitor. As described above, the input port RFin into which the high-frequency signal is inputted is connected to the gate of the first MOSFET FET1. The first MOSFET FET1 has a source grounded via the inductors Ls1, Ls2. In other words, the inductors Ls1, Ls2 function as inductors for source degeneration. As described above, the external inductor Lext and the inductors Ls1, Ls2 form an input matching circuit, and their functions achieve desired impedance matching taking gain matching and noise matching of the first MOSFET FET1 into account.

The high-frequency signal inputted into the input port RFin is inputted to the gate of the first MOSFET FET1 via the inductor Lext. The high-frequency signal is amplified and outputted from an output port connected between VDD and the drain of the first MOSFET FET1. Accordingly, the signal is amplified by the input-side grounded capacitor Csh, the inductors Lext, Ls1, Ls2, the first MOSFET FET1, and the inductors Ld1, Ld2 on the output side. This is the function of an ordinary LNA, and therefore its detailed description is omitted. In this embodiment, a predetermined circuit is further incorporated between the drain of the first MOSFET FET1 and VDD to enhance the isolation performance at the split destination when the inputted high-frequency signal is split.

FIG. 4 is a chart listing the voltages to be applied to the terminals of the circuit in FIG. 3. For example, assuming VDD=1.8 V, High is 3 V and Low is, for example, −2V regarding Cont1 to Cont3, and High is, for example, 1.8 V and Low is, for example, 0 V regarding Cont4 and Cont5. The single output is a mode of outputting the amplified high-frequency signal from one of the LNA_OUT1 and the LNA_OUT2, and the split output is a mode of outputting the amplified high-frequency signal from both the LNA_OUT1 and the LNA_OUT2. Hereinafter, the circuit in each mode will be described.

First, in the single output, the case of outputting the amplified signal from the LNA_OUT1 will be described. In this case, the High voltage is applied to the Cont1, and the Low voltage is applied to the Cont2 and the Cont3. Further, the Low voltage is applied to the Cont4, and the High voltage is applied to the Cont5.

Application of the High voltage to the Cont1 turns on the first switch Sw1. On the other hand, application of the Low voltage to the Cont2 and the Cont3 turns off the second switch Sw2, the third switch Sw31, the fourth switch Sw32, and the fifth switch Sw33. Application of the Low voltage to the Cont4 brings a p-type MOSFET PMOS1 into a state where carriers can flow from the source to the drain, meanwhile application of the High voltage to the Cont5 eliminates movement of carriers between the source and the drain in a p-type MOSFET PMOS2. Appropriate bias voltage is applied to VB2.

By controlling the switches as described above, the inputted high-frequency signal is inputted into the gate of the first MOSFET FET1, and a path is formed between VDD and the drain of the MOSFET FET1 from the drain of the second MOSFET FET2 via the source and the switch Sw1. Because the switch Sw4 is turned off, the source of the first MOSFET FET1 is grounded via the state where the inductors Ls1, Ls2 are connected in series.

A resistor RB21 connected to the gate of the second MOSFET FET21 is provided to prevent the high-frequency signal from being transmitted to a bias potential generation circuit. Further, for a capacitor CB21 to function as an earth capacitor, the second MOSFET FET21 functions as a grounded-gate FET. These functions also apply to a third MOSFET FET22, a capacitor CB22, and a resistor RB22.

On the other hand, the second switch Sw2, the third switch Sw31, the fourth switch Sw32, and the fifth switch Sw33 are turned off. Further, the p-type MOSFET PMOS2 is turned off, so that the drain of the third MOSFET FET22 is brought into a state of being grounded.

Figure 5:
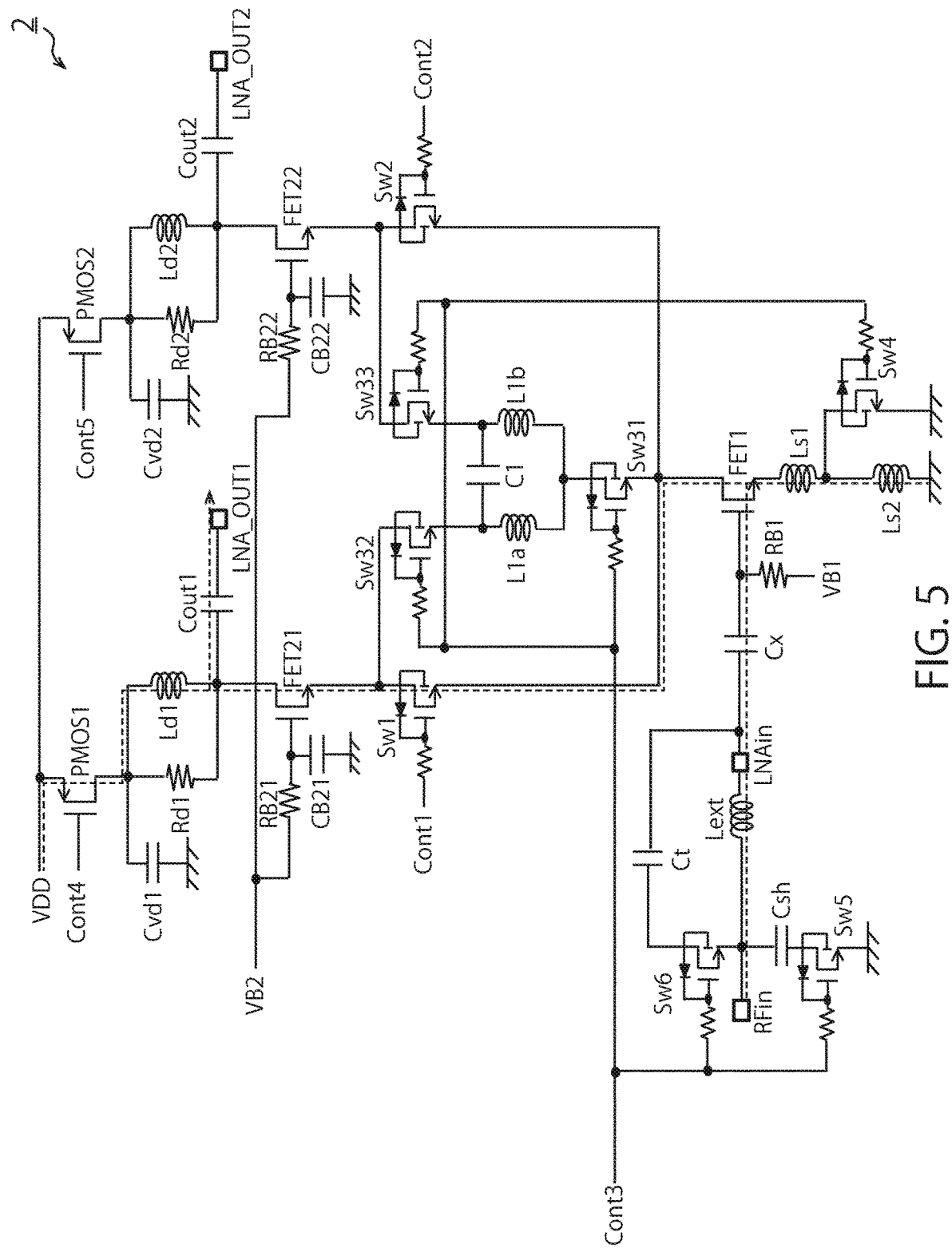
FIG. 5 illustrates an example of a path in a single output mode in the circuit in FIG. 3.

FIG. 5 is a diagram illustrating a schematic signal transmission path in the case of the single output from the output port LNA_OUT1, namely, the case where the states of the switches are those in the above. The high-frequency signal inputted from the input port RFin follows a path of a broken line and is outputted from the output port LNA_OUT1.

More specifically, in this case, the inputted signal is inputted via the inductor Lext and the capacitor Cx into the gate of the MOSFET FET1. In the following, the capacitor Cx is called a gate capacitor Cx connected to the gate of the MOSFET FET1. The gate capacitor Cx functions as a DC blocking capacitor that prevents DC voltage from being applied to the MOSFET FET1. Bias voltage VB1 is applied between the gate capacitor Cx and the gate of the first MOSFET FET1. The resistor RB1 is provided to prevent the high-frequency signal from being transmitted to the circuit that generates the bias voltage VB1.

Since the MOSFETs FET21, PMOS1 are in a state where carriers can move between the drain and the source, the drain of the MOSFET FET1 is connected to the inductor Ld1, and the inductor Ld1 has another terminal, which is not the terminal connected to the drain of the MOSFET FET1, connected to VDD.

As described above, a circuit such as VDD-inductor Ld1-MOSFET FET1-inductors Ls1, Ls2-ground is formed to generate the amplified high-frequency signal between the inductor Ld1 and the drain of the MOSFET FET1. The output port LNA_OUT1 outputs the amplified high-frequency signal.

The inductors Ld1, Ld2 are inductors for output matching, and the resistors Rd1, Rd2 connected in parallel with the inductors are provided for a fixed-gain and stabilization. Besides, the Cout1, Cout2 connected between the output ports and the path are output matching capacitors. The inductors Ld1, Ld2, the capacitors Cout1, Cout2, and the resistors Rd1, Rd2 form an output matching circuit.

As described above, in the single output mode, the high-frequency signal inputted into the input port RFin is outputted from the output port LNA_OUT1. The operations of the switches are the same also in the single output mode of outputting the signal from the output port LNA_OUT2. In the case of outputting the signal from the output port LNA_OUT2 in the single output mode, voltages are applied as in the second row in FIG. 4.

Next, a split output mode, namely, the case of outputting the signal from both the output ports LNA_OUT1, LNA_OUT2 will be described. In this case, as illustrated in FIG. 4, the Low voltage is applied to the Cont1 and the Cont2, and the High voltage is applied to the Cont3. Further, the Low voltage is applied to the Cont4 and the Cont5.

Application of the Low voltage to the Cont1 and the Cont2 turns off the first switch Sw1 and the second switch Sw2. On the other hand, application of the High voltage to the Cont3 turns on the third switch Sw31, the fourth switch Sw32, the fifth switch Sw33, and the switches Sw4, Sw5, Sw6. Further, application of the Low voltage to the Cont4 and Cont5 brings the p-type MOSFETs PMOS1, PMOS2 into a state where carriers can flow between the source and the drain.

Figure 6:
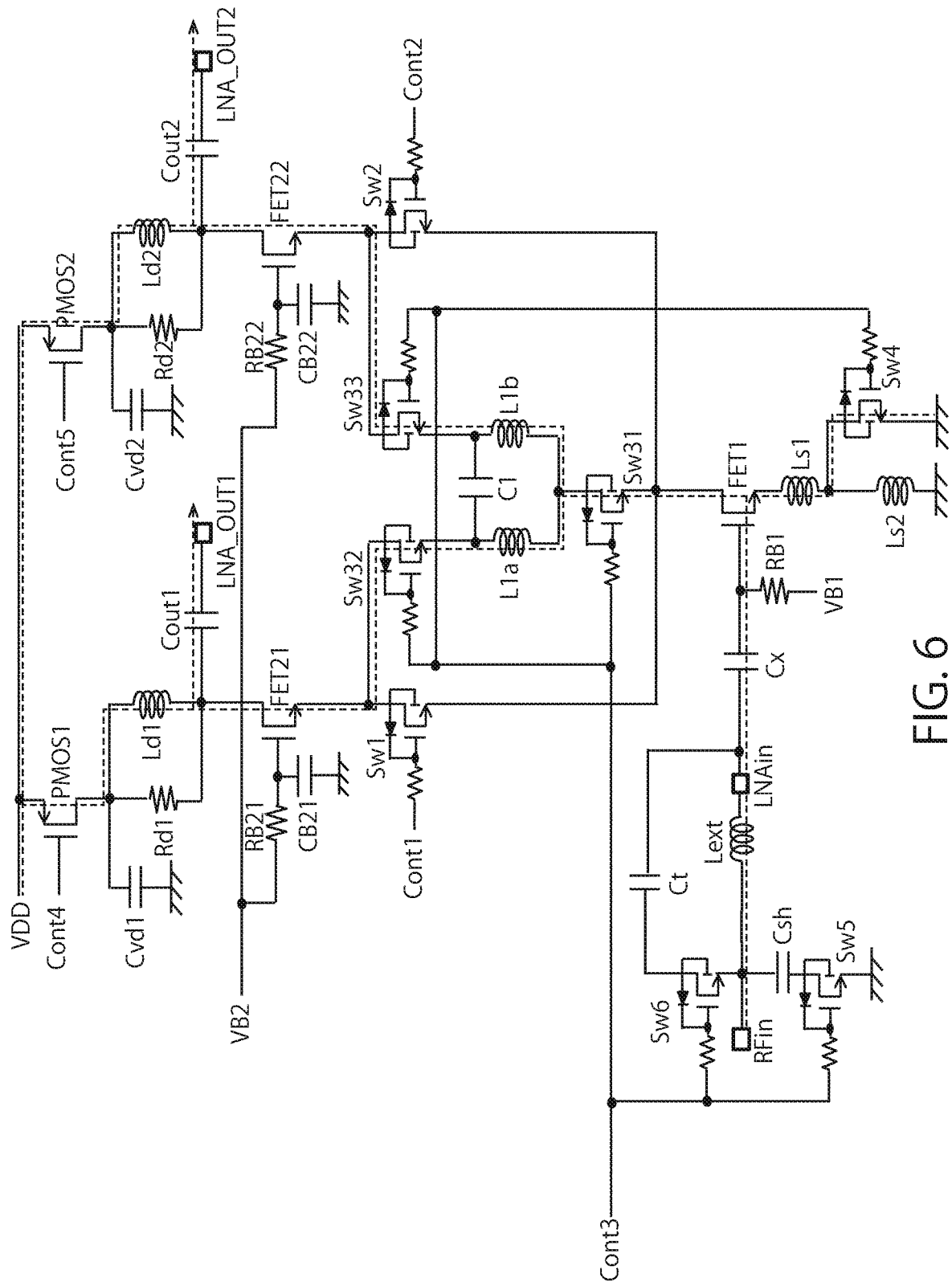
FIG. 6 illustrates an example of a path in a split output mode in the circuit in FIG. 3.

FIG. 6 is a diagram illustrating a schematic signal transmission path in the case of split output from both the output ports LNA_OUT1, LNA_OUT2, namely, the case where the states of the switches are those in the above. The high-frequency signal inputted from the input port RFin follows the path of a broken line and is outputted from each of the output ports LNA_OUT1, LNA_OUT2.

More specifically, in this case, the inputted signal is inputted via the inductor Lext and the gate capacitor Cx into the gate of the MOSFET FET1. Since the MOSFETs FET21, PMOS1 are in a state where carriers can move between the drain and the source, the drain of the MOSFET FET1 is connected to the inductor L1a, and is connected to VDD via the inductor Ld1. Similarly, since the MOSFETs FET21, PMOS2 are in a state where carriers can move between the drain and the source, the drain of the MOSFET FET1 is connected to the inductor L1b, and is connected to VDD via the inductor Ld2.

As described above, a circuit such as VDD-inductor Ld1-inductor L1a-MOSFET FET1-inductor Ls1-ground is formed in a path connected to the LNA_OUT1, and a circuit such as VDD-inductor Ld2-inductor L1b-MOSFET FET1- inductor Ls1-ground is formed in a path connected to the LNA_OUT2. The output ports LNA_OUT1, LNA_OUT2 output the amplified high-frequency signals.

In the split output mode, the operations of the inductors L1a, L1b and the capacitor C1 can improve the isolation characteristics between the output port LNA_OUT1 and the output port LNA_OUT2. This is because setting the inductance and the capacitance to cause the inductors L1a, L1b and the capacitor C1 to resonate in a band of the high-frequency signal can prevent the high-frequency signal entering from the output port LNA_OUT1 from being transmitted to the output port LNA_OUT2 or prevent the high-frequency signal entering from the output port LNA_OUT2 from being transmitted to the output port LNA_OUT1. Further, the switch Sw4 changes the inductance on the source side of the MOSFET FET1 and thereby can improve the gain in the split output.

Further, turning on the switches Sw5, Sw6 provides the input-side resonant capacitor Ct in parallel with the inductor Lext and connects the inductor Lext to the input-side grounded capacitor Csh. The input-side resonant capacitor Ct and the input-side grounded capacitor Csh are enabled as described above, and thereby suppress degradation in S11 caused by the change in inductance on the source side of the MOSFET FET1.

Hereinafter, a simulation result of a parameter and so on representing the input/output characteristics in the single output mode of this embodiment will be described. It is assumed that the bias current Idd=6.2 mA. The bias current Idd is current flowing into the semiconductor device 1 from the VDD terminal when the high-frequency signal is not inputted thereinto. Generally, when the Idd is set to a large value in an appropriate range, a high gain and a low NF are realized.

Figure 7:
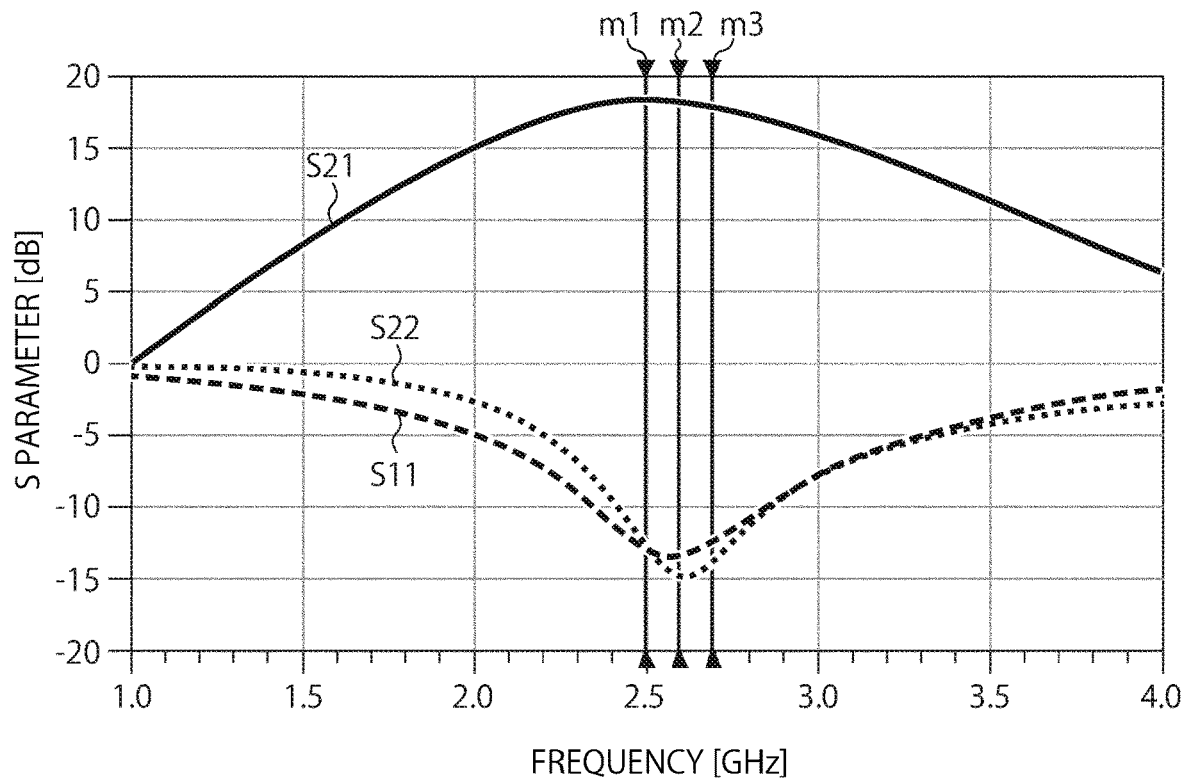
FIG. 7 to FIG. 14 illustrate data regarding the output of the circuit in FIG. 3.

FIG. 7 is a chart illustrating an S parameter (Scattering Parameter) being the input/output characteristic in the single output mode by the LNA using the semiconductor device 1 according to this embodiment. FIG. 7 is a chart illustrating the result regarding the semiconductor device 1 adjusted in a frequency band Band41 (2496 MHz to 2690 MHz). For easy description, the input port is expressed as a port 1, the output port is expressed as a port 2, S parameters are expressed as S21 and so on. A solid line indicates S21, a broken line indicates S11, and a dotted line indicates S22.

The degree of amplifying the output signal with respect to the input signal can be expressed by S21. A larger S21 in a frequency band on which attention is focused indicates a higher gain. The degree of reflection of the input signal with respect to the port on the input side is represented by S11, and the degree of reflection with respect to the port on the output side is represented by S22. The S11, S22 are desired to be low (for example, to be −10 dB or less) because they are required, in principle, to have an impedance match at the input/output ports in a high-frequency circuit.

As illustrated in the chart, it is found that the curve of S21 has a high value in the focused frequency band Band41. On the other hand, the curves of S11 and S22 are suppressed to be low in the focused frequency band. More specifically, m1 in the chart is a point indicating observation in a frequency of 2496 MHz, m2 is a point indicating observation in a frequency of 2593 MHz, and m3 is a point indicating observation in a frequency of 2690 MHz.

At m1, S21=18.4 dB, S11=−12.9 dB, and S22=−12.5 dB. At m2, S21=18.2 dB, S11=−13.4 dB, and S22=−14.8 dB. At m3, S21=17.9 dB, S11=−12.4 dB, and S22=−13.7 dB. As described above, in the focused frequency band, S21 becomes high, namely, is sufficiently amplified, whereas S11, S22 indicating the reflection characteristics are suppressed to be sufficiently low.

Figure 8:
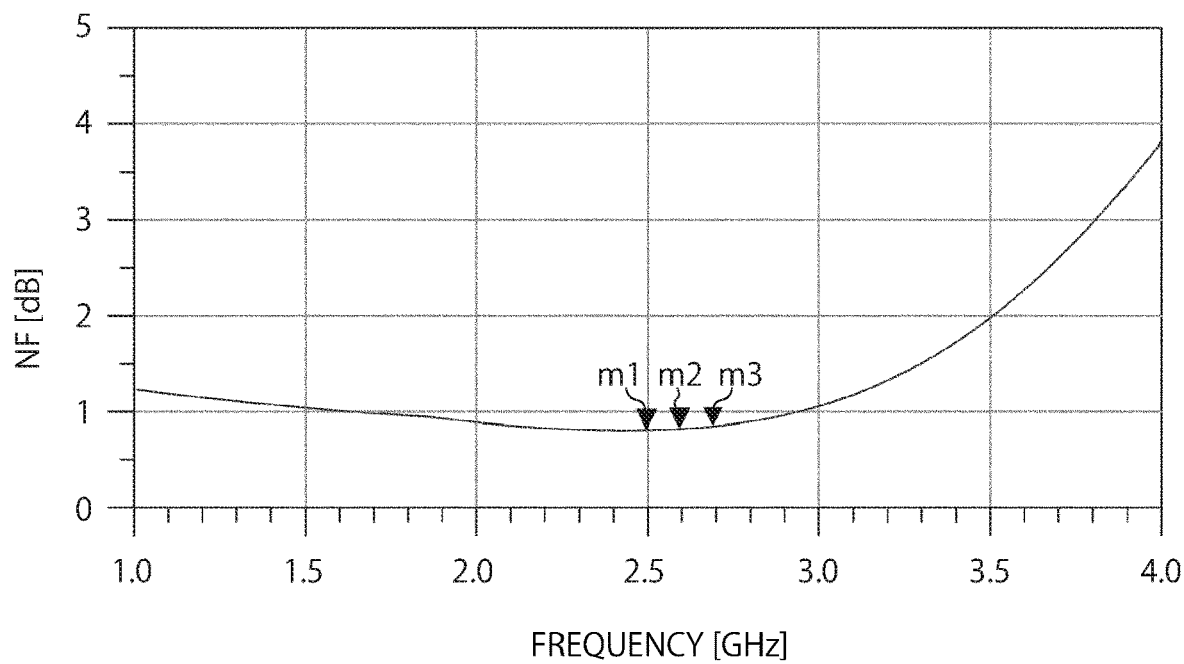

FIG. 8 is a chart illustrating a noise figure (NF) in the single output mode. M1 to m3 indicate observation points at frequencies of 2496 MHz, 2593 MHz, 2690 MHz as in the description of FIG. 7. At m1, NF=0.81 dB, at m2, NF=0.82 dB, and at m3, NF=0.85 dB each of which is an excellent value at a degree of not exceeding 0.85 dB.

Figure 9:
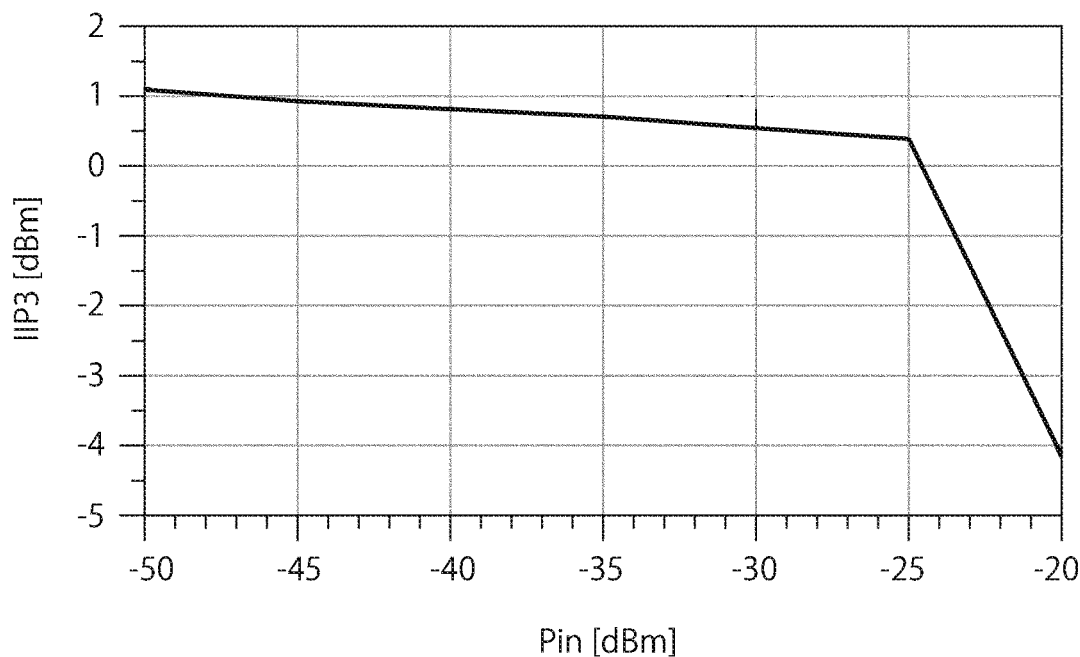

FIG. 9 is a chart illustrating a Pin dependence of IIP3 (Input 3rd-order Intercept Point) in the single output mode. The IIP3 at a power level Pin of the input signal=−30 dBm is 0.54 dBm which is an excellent value.

Figure 10:
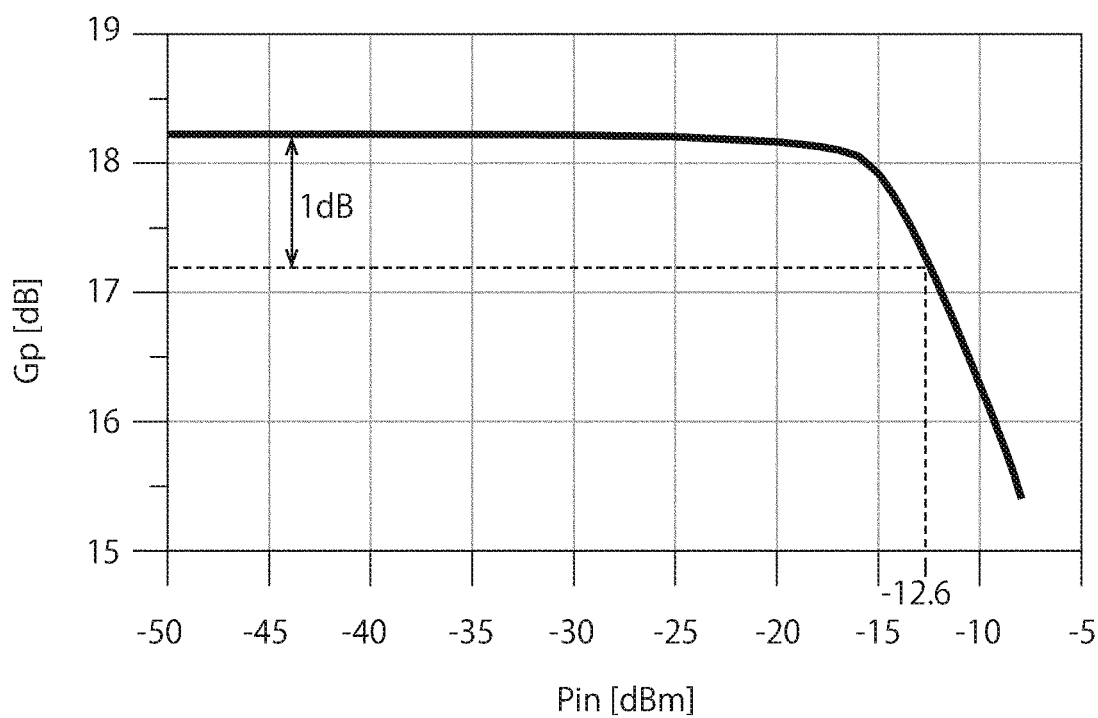

FIG. 10 is a chart illustrating a relationship between the power level of the input signal and the gain Gp in the single output mode. The IP1 dB (1 dB Input Compression Point) found from this chart is −12.6 dBm which is an excellent value.

Subsequently, the result of the above index in the split output mode is illustrated. The bias current Idd is set to Idd=13.3 mA.

Figure 11:
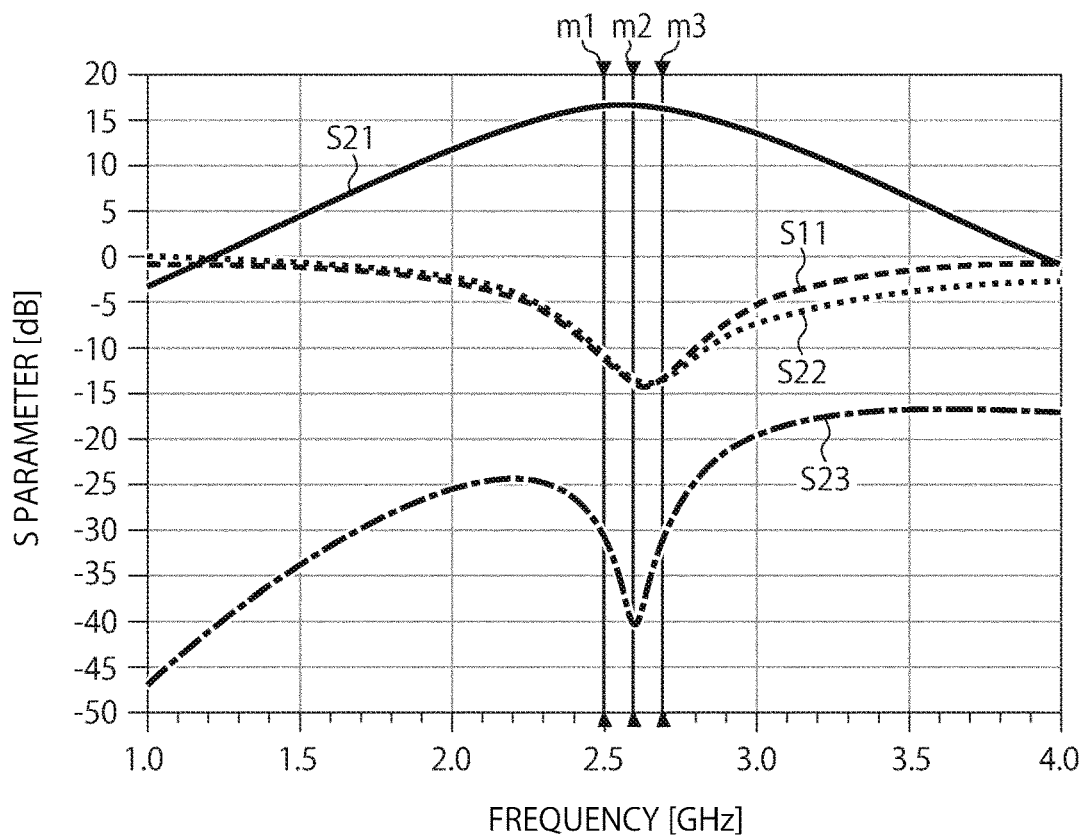

FIG. 11 is a chart illustrating the S parameter in the split output mode. The degree of amplifying the output signal with respect to the input signal is expressed as described above such that, as an example, the signal outputted from the output port LNA_OUT1 is expressed by S21. It is assumed, similarly in the above-described single output mode, that the reflection with respect to the input port is S11 and the reflection with respect to the output port LNA_OUT1 is S22. Further, a problem inherent to the split output mode is transmission of the signal between the output ports LNA_OUT1 and LNA_OUT2. The S parameter regarding the transmission from the output port LNA_OUT2 to the output port LNA_OUT1 is expressed as S23.

As illustrated in the chart, it is found that the curve of S21 is a high value in the focused frequency band Band41. It is found, on the other hand, that the curves of S11, S22 are suppressed to be low in the same frequency band. It is found that S23 regarding the isolation between output ports is suppressed to be lower. S23 is desired to be −25 dB or less. The ones represented by m1, m2, and m3 are the same as those in FIG. 7 and their values are described below.

At m1, S21=16.6 dB, S11=−10.9 dB, S22=−10.6 dB, and S23=−30.7 dB. At m2, S21=16.7 dB, S11=−13.9 dB, S22=−13.3 dB, and S23=−40.2 dB. At m3, S21=16.4 dB, S11=−13.2 dB, S22=−13.4 dB, and S23=−30.9 dB. As described above, in the focused frequency band, S21 becomes high, whereas S11, S22 are suppressed to be sufficiently low. Further, S23 is suppressed to a value sufficiently lower than −25 dB which is desired.

Figure 12:
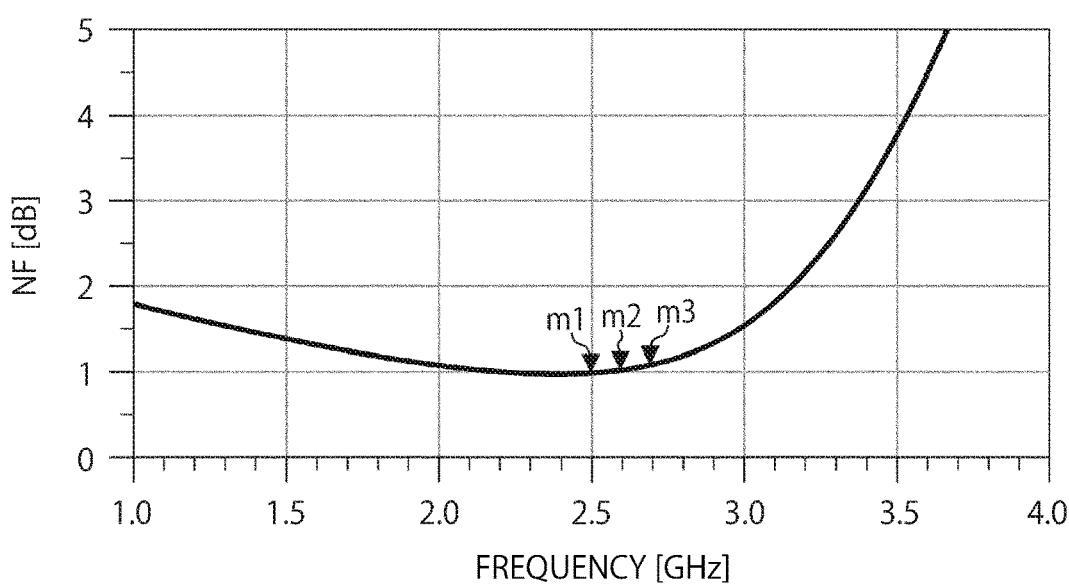

FIG. 12 is a chart illustrating the NF in the split output mode. M1 to m3 are the same as those in the description of FIG. 7. At m1, NF=0.99 dB, at m2, NF=1.0 dB, and at m3, NF=1.1 dB each of which is an excellent value of 1.1 dB or less.

Figure 13:
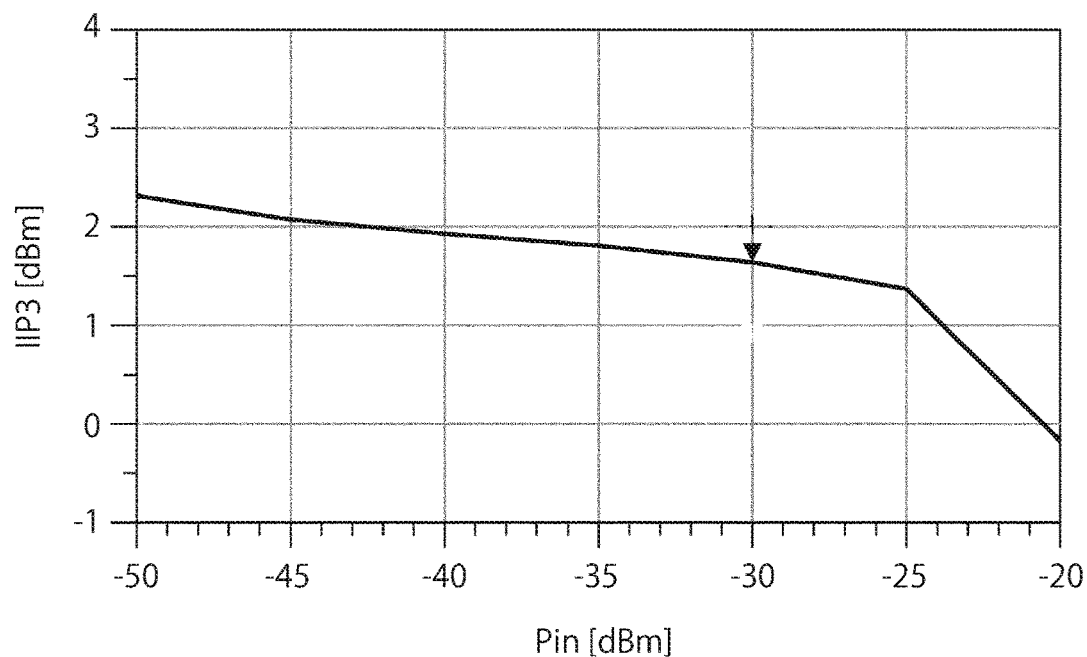

FIG. 13 is a chart illustrating the Pin dependence of IIP3 in the split output mode. The IIP3 at a power level of the input signal Pin=−30 dBm is 1.64 dBm which is an excellent value.

Figure 14:
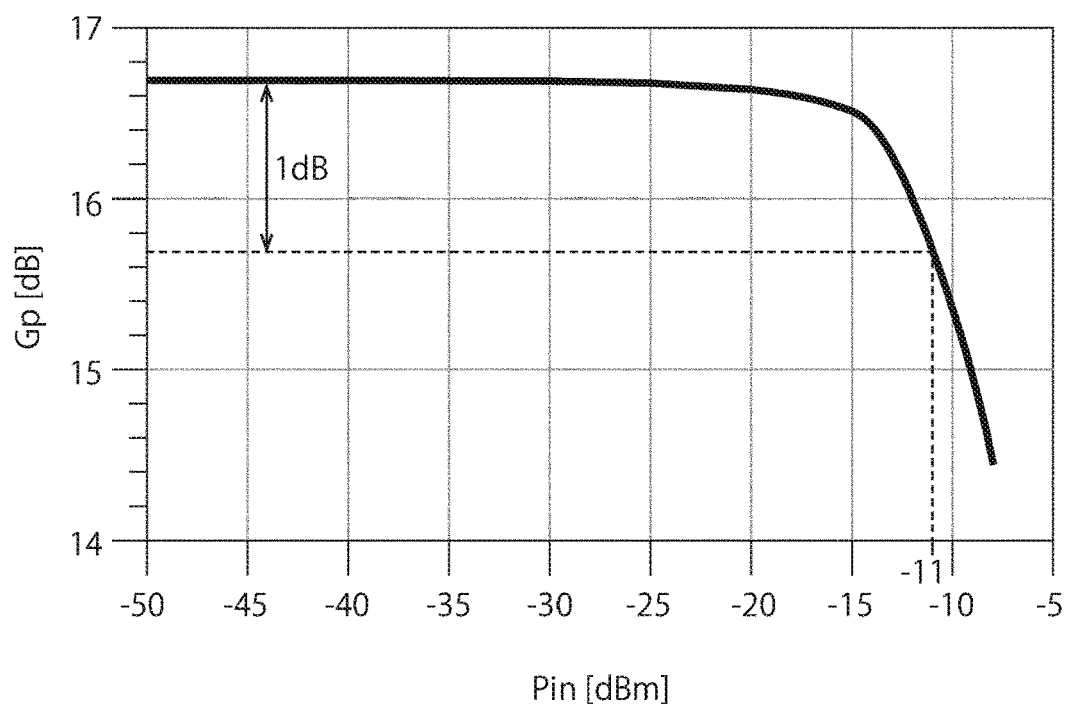

FIG. 14 is a chart illustrating the relationship between the power level of the input signal and the gain Gp in the split output mode. The IP1 dB found from this chart is −11.0 dBm which is an excellent value.

As described above, according to this embodiment, it is possible to provide an LNA with a split output mode excellent in isolation between outputs in the split output mode. This is because an LC parallel circuit of a series inductance of the inductors L1a, L1b and a capacitor C1 is set to resonate in a desired frequency band. Further, since the inductance between the source at which the first MOSFET FET1 is grounded and the ground point can be controlled within a range where the NF in each of the signal output mode and the split output mode is excellent, the gain in the split output mode can be increased. Note that it is possible to cope with the other frequency band by appropriately changing the inductance of each inductor and the capacitance of each capacitor.

Element constants of circuit constituting elements are as indicated as follows with a gate oxide film thickness as Tox [nm], a gate length as Lg [um], and a gate width as Wg [um].

TABLE 1

| FET name | Tox | Lg | Wg |
| --- | --- | --- | --- |
| MOSFET FET1 | 2.5 | 0.14 | 300 |
| MOSFETs FET21, FET22 | 2.5 | 0.14 | 300 |
| FETs of Switches Sw1, Sw2, Sw31, Sw32, Sw33 | 5.5 | 0.21 | 500 |

Note that the above-described values are merely indicated as examples and the element constants are not limited to them. This also applies to the following description. A more important point is the configuration of the circuit illustrated in FIG. 3 and so on.

Modified Example

It is also possible to further improve the performance by imposing a restriction in the above embodiment. In this modified example, the performance is improved by making the drain conductance of the second MOSFET FET21 and the third MOSFET FET22 smaller than that of the first MOSFET FET1.

To realize the above improvement, for example, in the case of forming the MOSFET FET on the SOI, the gate lengths of the second MOSFET FET21 and the third MOSFET FET22 are made larger than the gate length of the first MOSFET FET1. In addition, the gate oxide film thicknesses of the second MOSFET FET21 and the third MOSFET FET22 may be made larger than the gate oxide film thickness of the first MOSFET FET1.

Hereinafter, the S parameter in the case of setting the gate lengths and the gate oxide film thicknesses as described above will be described.

Figure 15:
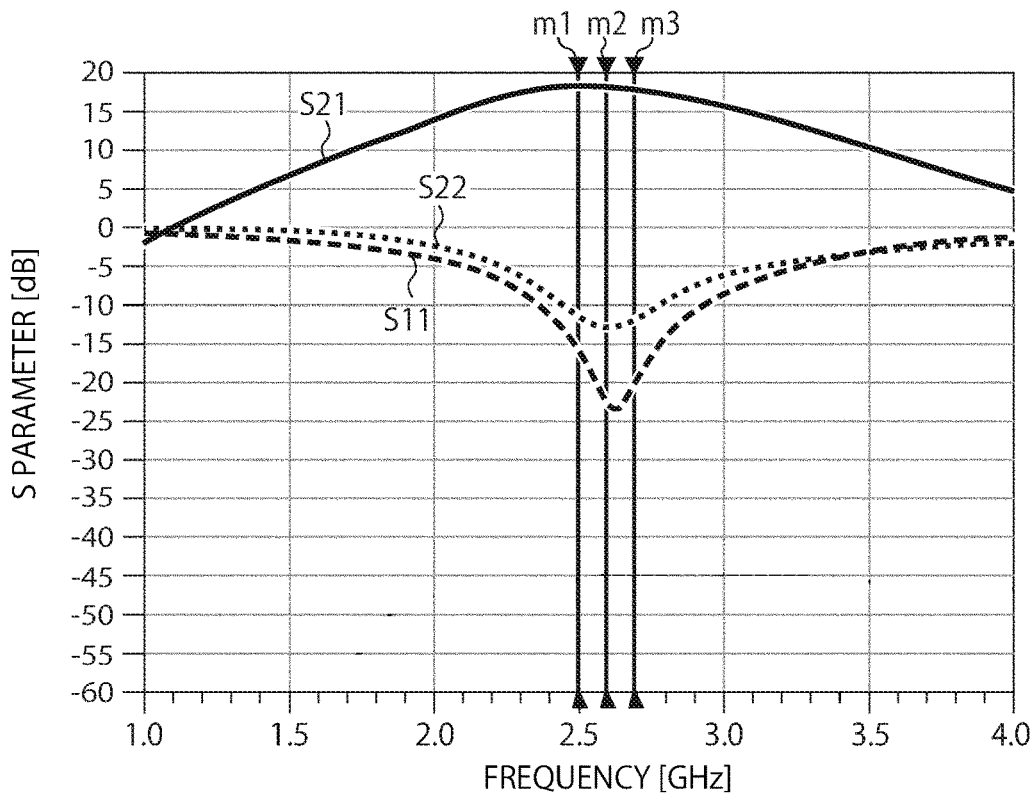
FIG. 15 illustrates an S parameter in the single output mode of a circuit in a modified example.

FIG. 15 is a chart illustrating the S parameter in the single output mode by the LNA using the semiconductor device 1 according to this modified example. S21, S11, S22 and m1, m2, m3 are the same as those in the description of above FIG. 11. In this modified example, it is assumed that the bias current Idd is Idd=6.6 mA.

At m1, S21=18.3 dB, S11=−15.7 dB, and S22=−11.4 dB. At m2, S21=18.2 dB, S11=−22.4 dB, and S22=−12.7 dB. At m3, S21=17.9 dB, S11=−20.0 dB, and S22=−11.7 dB. As described above, in the focused frequency band, S21 becomes high, whereas S11, S22 are suppressed to be sufficiently low.

Figure 16:
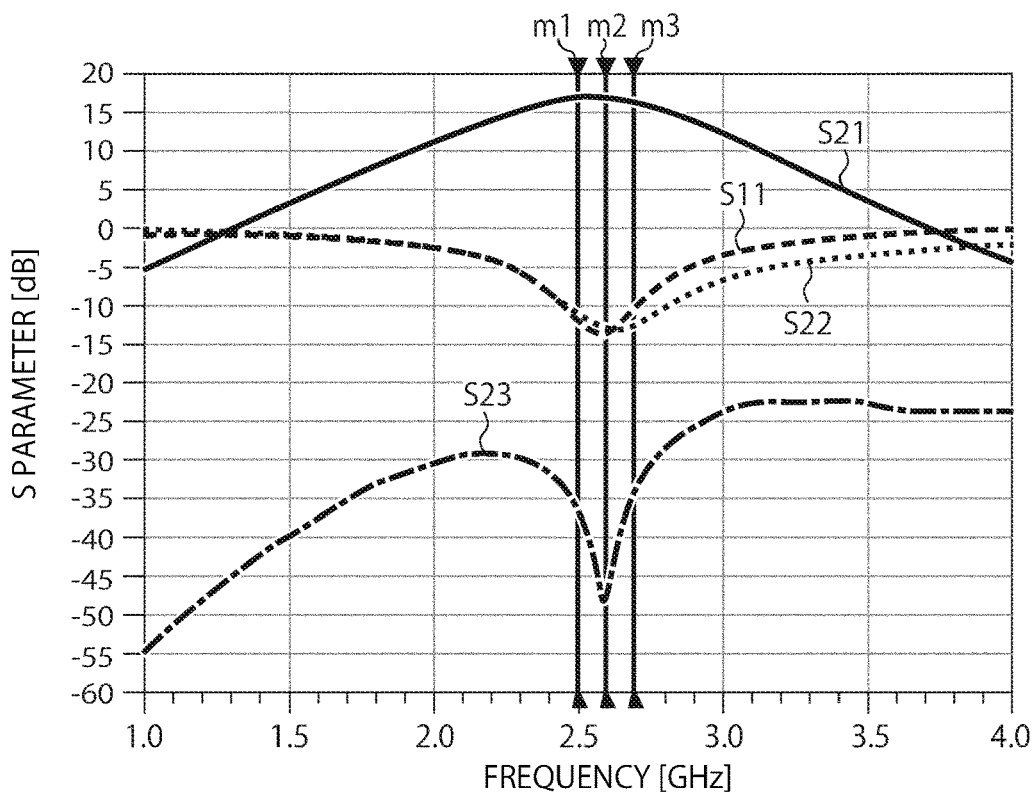
FIG. 16 illustrates the S parameter in the split output mode of the circuit in FIG. 15.

FIG. 16 is a chart illustrating the S parameter in the split output mode by the LNA using the semiconductor device 1 according to this modified example. The bias current Idd is set to Idd=13.9 mA. At m1, S21=17.1 dB, S11=−11.7 dB, S22=−10.8 dB, and S23=−36.2 dB. At m2, S21=17.0 dB, S11=−13.2 dB, S22=−12.8 dB, and S23=−47.6 dB. At m3, S21=16.4 dB, S11=−10.0 dB, S22=−12.3 dB, and S23=−34.3 dB. As described above, in the focused frequency band, S21 becomes high, whereas S11, S22 are suppressed to be sufficiently low. Further, S23 is suppressed to a value sufficiently lower than −25 dB which is desired.

As illustrated in the charts, it is found that the curve of S21 is a high value in the focused frequency band Band41 in the case of any of the single output mode and the split output mode. It is found, on the other hand, that the curves of S11, S22 are suppressed to be low in the same frequency band. It is found that S23 regarding the isolation between output ports in the split output mode is suppressed to be lower.

As described above, the high isolation performance between the output ports can be realized also according to this modified example. Imposing a restriction to the gate length and the gate oxide film thickness as compared with the semiconductor device 1 according to the above embodiment can further improve the isolation characteristics. This is because the drain conductance of the MOSFET on the path transmitting the signal can be suppressed to be lower than that in the above-described embodiment in the split output mode.

Element constants of circuit constituting elements are as indicated as follows.

TABLE 2

| FET name | Tox | Lg | Wg |
| --- | --- | --- | --- |
| MOSFET FET1 | 2.5 | 0.14 | 300 |
| MOSFETs FET21, FET22 | 5.5 | 0.21 | 300 |
| FETs of Switches Sw1, Sw2, Sw31, Sw32, Sw33 | 5.5 | 0.21 | 500 |

Second Embodiment

Figure 17:
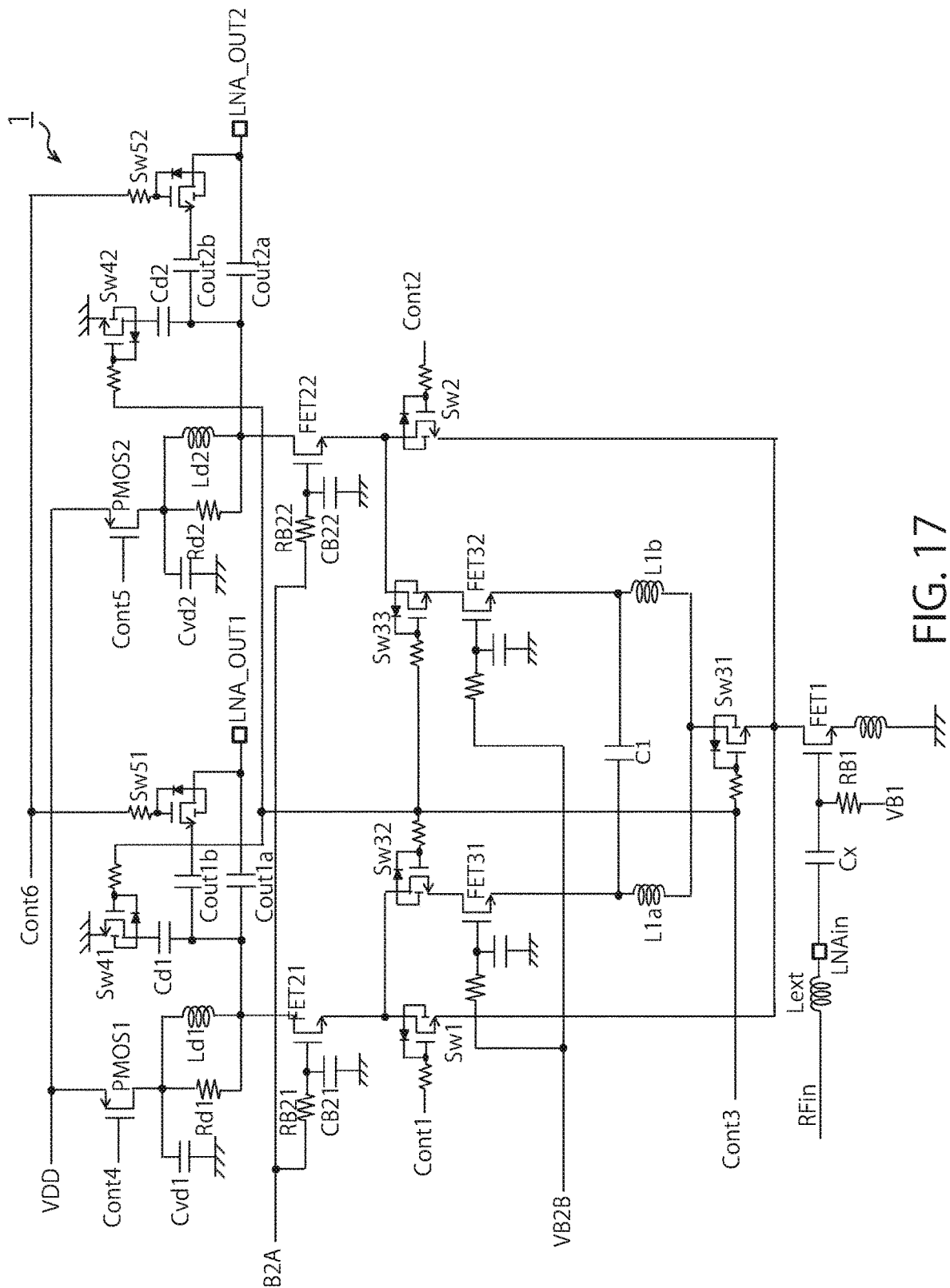
FIG. 17 is a circuit diagram of an LNA according to an embodiment.

FIG. 17 is a diagram illustrating a semiconductor device 1 according to a second embodiment. The semiconductor device 1 according to this embodiment is configured to change, between the single output mode and the split output mode, the number of MOSFETs each having a drain and a source between which an amplified high-frequency signal passes and having a gate grounded. Further, FIG. 18 is a table listing the voltages to be applied to the terminals in the single output mode and the split output mode. This is the same as FIG. 4 and its detailed description is omitted.

A fourth MOSFET FET31 having a gate grounded is provided between the fourth switch Sw32 and the inductor L1a of the semiconductor device 1 according to the above embodiment, and a fifth MOSFET FET32 having a gate grounded is similarly provided between the fifth switch Sw33 and the inductor L1b.

Further, the matching capacitors Cout1, Cout2 on the output side are configured to have parallel configurations of capacitors Cout1a, Cout1b and capacitors Cout1a, Cout2b respectively to change the capacitance between the single output mode and the split output mode. The capacitors Cout1b, Cout2b are set to be enabled in the single output mode by the functions of switches Sw51, Sw52, and are controlled so that the matching capacitance becomes larger in the single output mode.

On the other hand, switches Sw41, Sw42 are switches turned on in the split output mode, and these switches attain output matching in the split output mode by the capacitors Cd1, Cd2 connected to the capacitors Cout1, Cout2. The installation of the capacitors on the output side is illustrated as one example, and may be the same installation of the capacitors as that in the above first embodiment.

Figure 19:
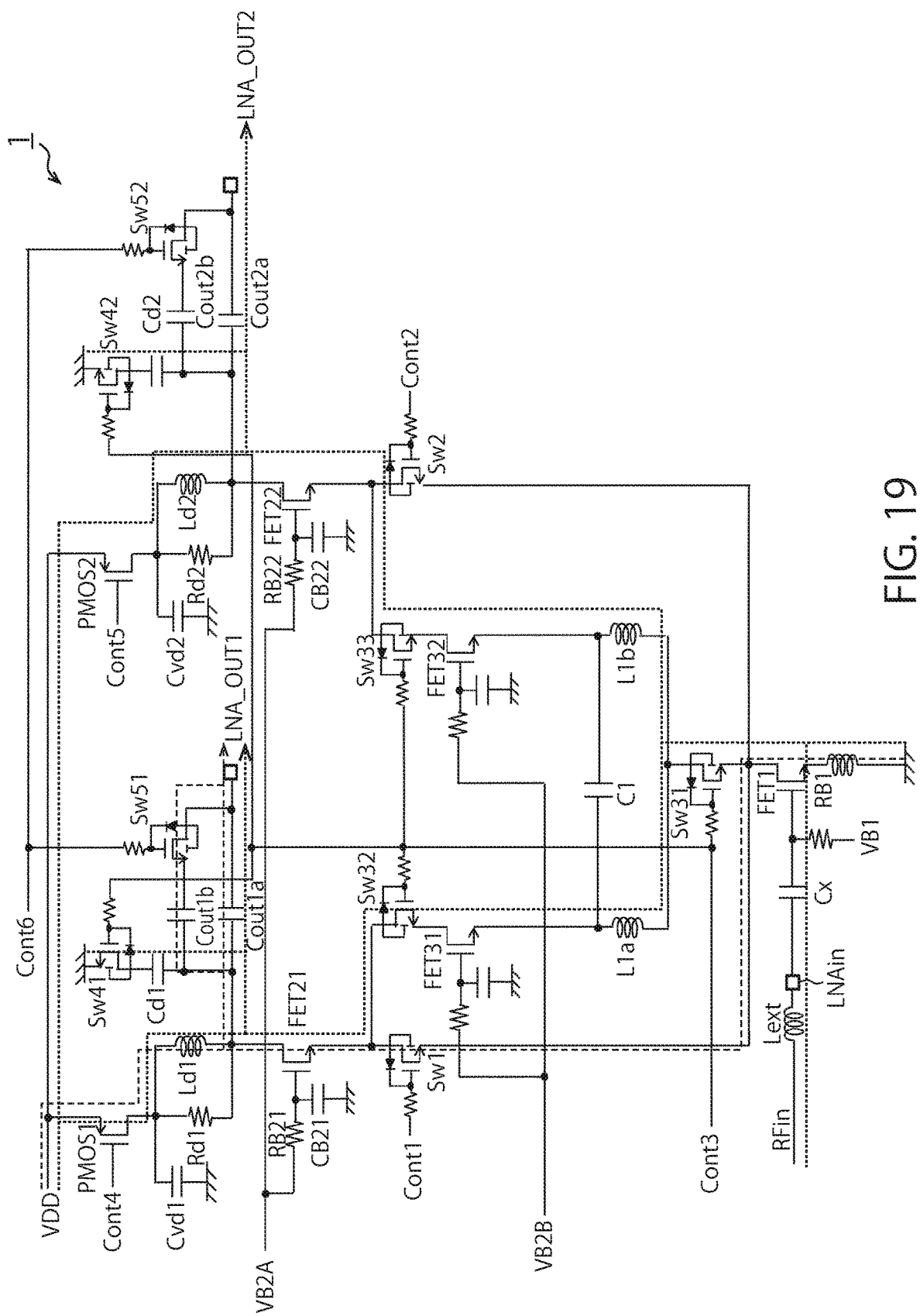

FIG. 19 is a diagram illustrating a path in the case of application of the voltages illustrated in FIG. 18. A path indicated with a broken line illustrates a path in the case of outputting the signal to the output port LNA_OUT1 in the single output mode, and a path indicated with a dotted line is a path of outputting the signal to both the output ports LNA_OUT1, LNA_OUT2 in the split output mode.

In the single output mode, the high-frequency signal inputted into the gate of the first MOSFET FET1 passes through the second MOSFET FET21 and the parallel capacitor of the capacitors Cout1a, Cout1b, and is outputted to the output port LNA_OUT1. On the other hand, in the split output mode, the high-frequency signal inputted into the gate of the first MOSFET FET1 passes through the inductor L1a, the fourth MOSFET FET31, the second MOSFET FET21, and the capacitor Cout1a, and is outputted to the output port LNA_OUT1, and similarly passes through the inductor L1b, the fifth MOSFET FET32, the third MOSFET FET22, and the capacitor Cout2a, and is outputted to the output port LNA_OUT2.

As described above, the number of MOSFETs through which the signal passes from the input port to the output port is changed between the single output mode and the split output mode. This enables control of the bias voltages VB2A, VB2B, thereby making it possible to control the gains in the single output mode and the split output mode from the outside of the semiconductor device 1.

Hereinafter, simulation results of parameters and so on in the single output mode are illustrated. It is assumed that the bias current Idd is Idd=6.26 mA.

Figure 20:
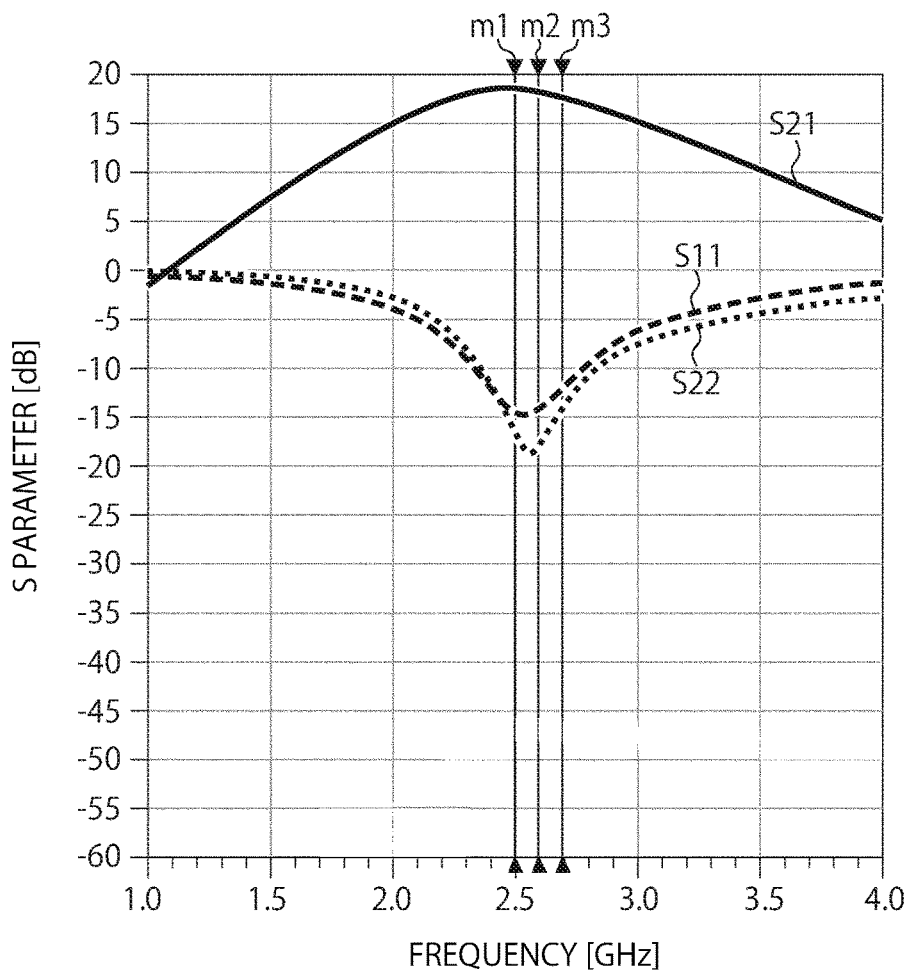

FIG. 20 is a chart illustrating the S parameter in the single output mode by the LNA using the semiconductor device 1 according to this embodiment. S21, S11, S22 and m1, m2, m3 are the same as those in the above description of FIG. 11.

At m1, S21=18.6 dB, S11=−14.5 dB, and S22=−16.6 dB. At m2, S21=18.3 dB, S11=−14.2 dB, and S22=−18.0 dB. At m3, S21=17.8 dB, S11=−11.8 dB, and S22=−14.1 dB. As described above, in the focused frequency band, S21 becomes high, namely, is sufficiently amplified, whereas S11, S22 indicating the reflection characteristics are suppressed to be sufficiently low.

Figure 21:
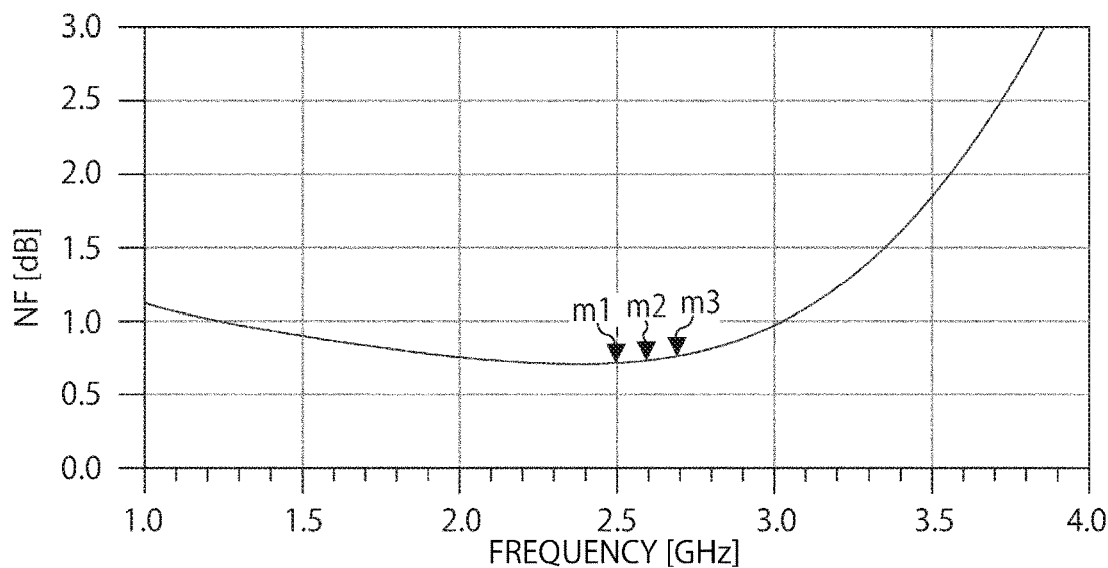

FIG. 21 is a chart illustrating the NF in the single output mode. M1 to m3 are the same as those in the description of FIG. 7. At m1, NF=0.72 dB, at m2, NF=0.73 dB, and at m3, NF=0.76 dB each of which is an excellent value of 0.76 dB or less.

Figure 22:
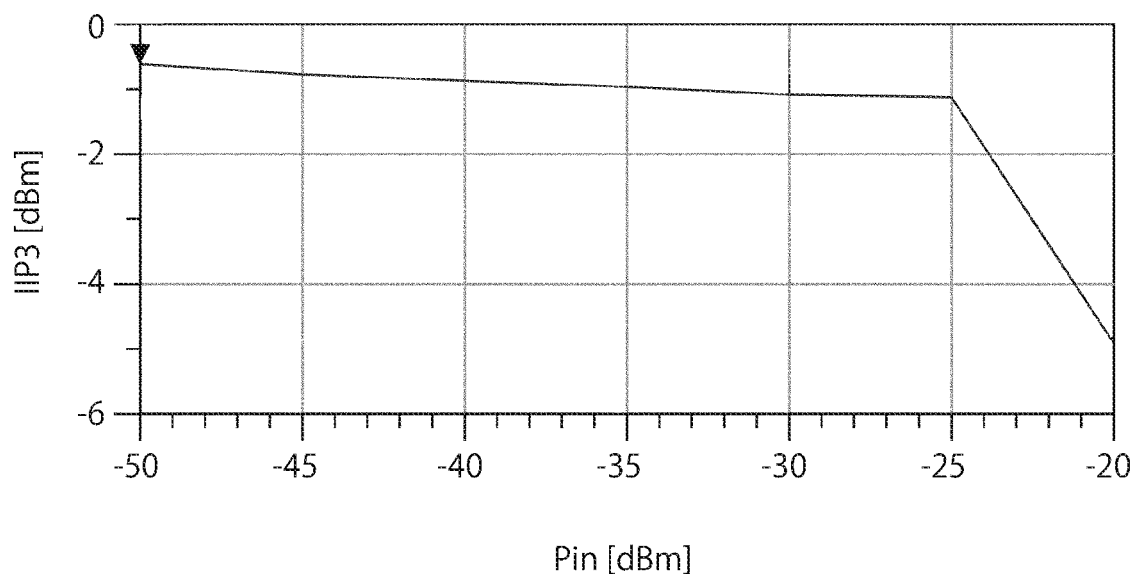

FIG. 22 is a chart illustrating the Pin dependence of IIP3 in the single output mode. The IIP3 at a power level of the input signal Pin=−30 dBm is 1.08 dBm which is an excellent value.

Figure 23:
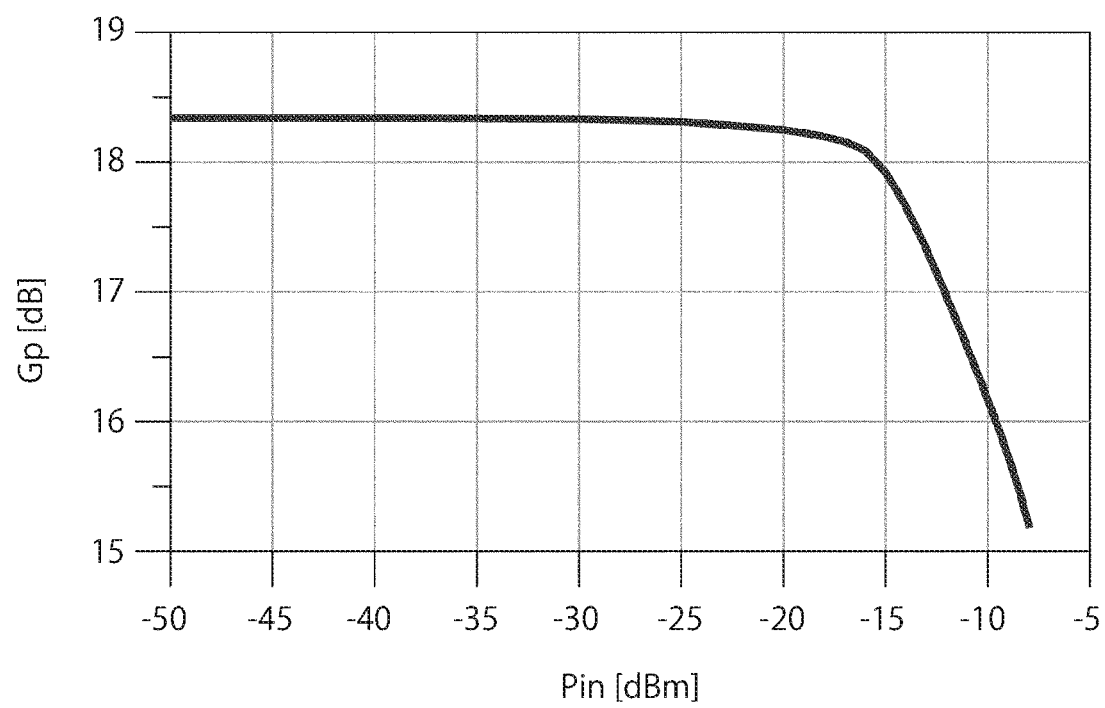

FIG. 23 is a chart illustrating the relationship between the power level of the input signal and the gain Gp in the single output mode. The IP1 dB found from this chart is −13.1 dBm which is an excellent value.

Next, simulation results of parameters and so on in the split output mode are illustrated. It is assumed that the bias current Idd is Idd=12.2 mA.

Figure 24:
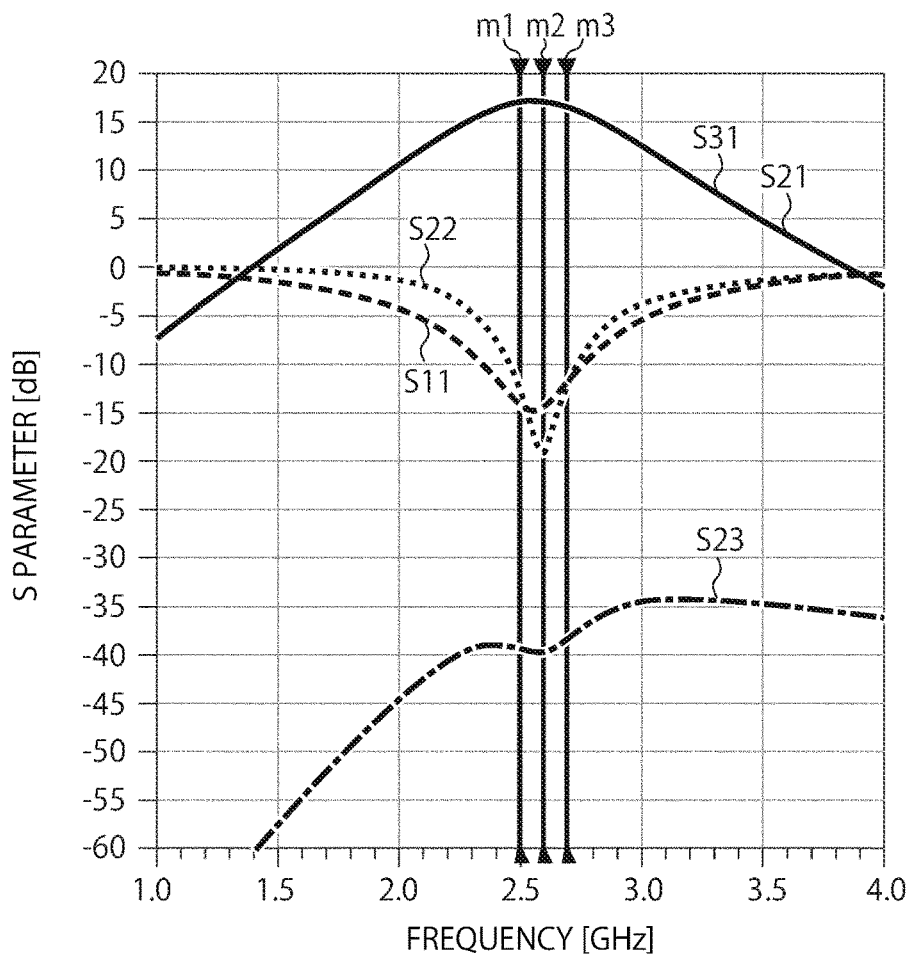

FIG. 24 is a chart illustrating the S parameter in the split output mode. S21, S11, S22, S23 and m1, m2, m3 are the same as those in the above description of FIG. 11. Further, transmission from the input port RFin to the output port LNA_OUT2 is illustrated as S31. Note that graphs of S21 and S31 are almost overlapped with each other in FIG. 24.

At m1, S21=17.1 dB, S31=17.1 dB, S11=−14.2 dB, S22=−12.4 dB, and S23=−39.4 dB. At m2, S21=17.1 dB, S31=17.1 dB, S11=−14.6 dB, S22=−18.8 dB, and S23=−39.4 dB. At m3, S21=16.6 dB, S31=16.6 dB, S11=−12.0 dB, S22=−12.7 dB, and S23=−38.4 dB. As described above, in the focused frequency band, S21, S31 become high, whereas S11, S22 are suppressed to be sufficiently low. Further, S23 is suppressed to a value sufficiently lower than −25 dB which is desired.

Figure 25:
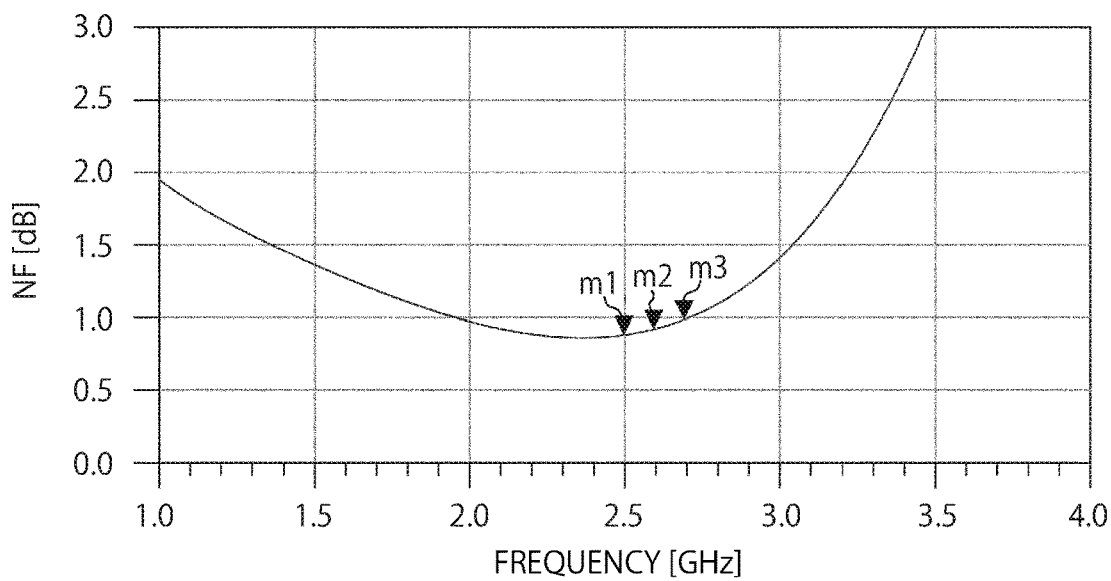

FIG. 25 is a chart illustrating the NF in the split output mode. M1 to m3 are the same as those in the description of FIG. 7. At m1, NF=0.88 dB, at m2, NF=0.92 dB, and at m3, NF=0.98 dB each of which is an excellent value of 0.98 dB or less.

Figure 26:
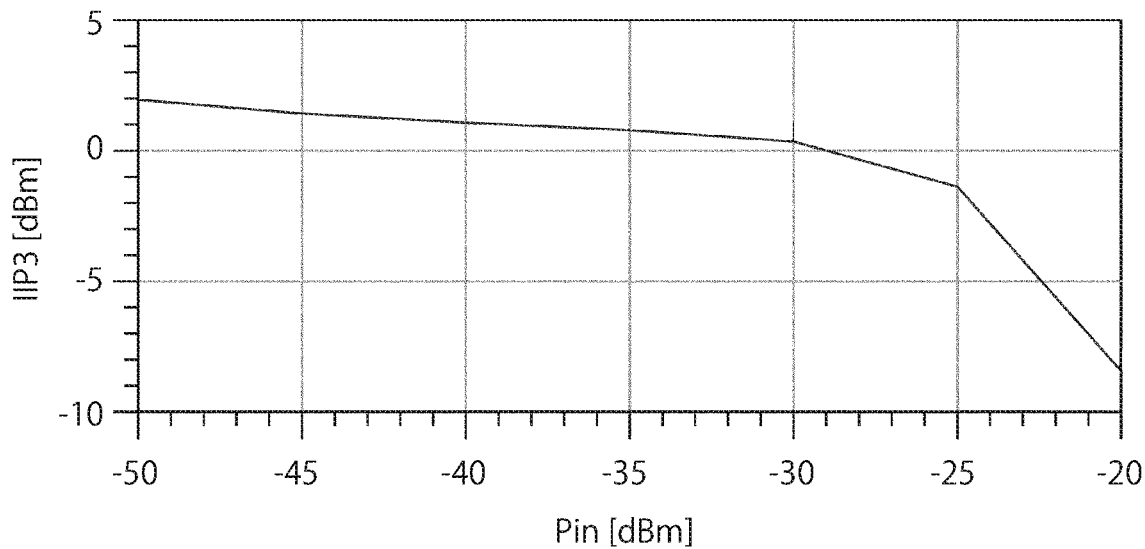

FIG. 26 is a chart illustrating the Pin dependence of IIP3 in the split output mode. The IIP3 at a power level of the input signal Pin=−30 dBm is 0.35 dBm which is an excellent value.

Figure 27:
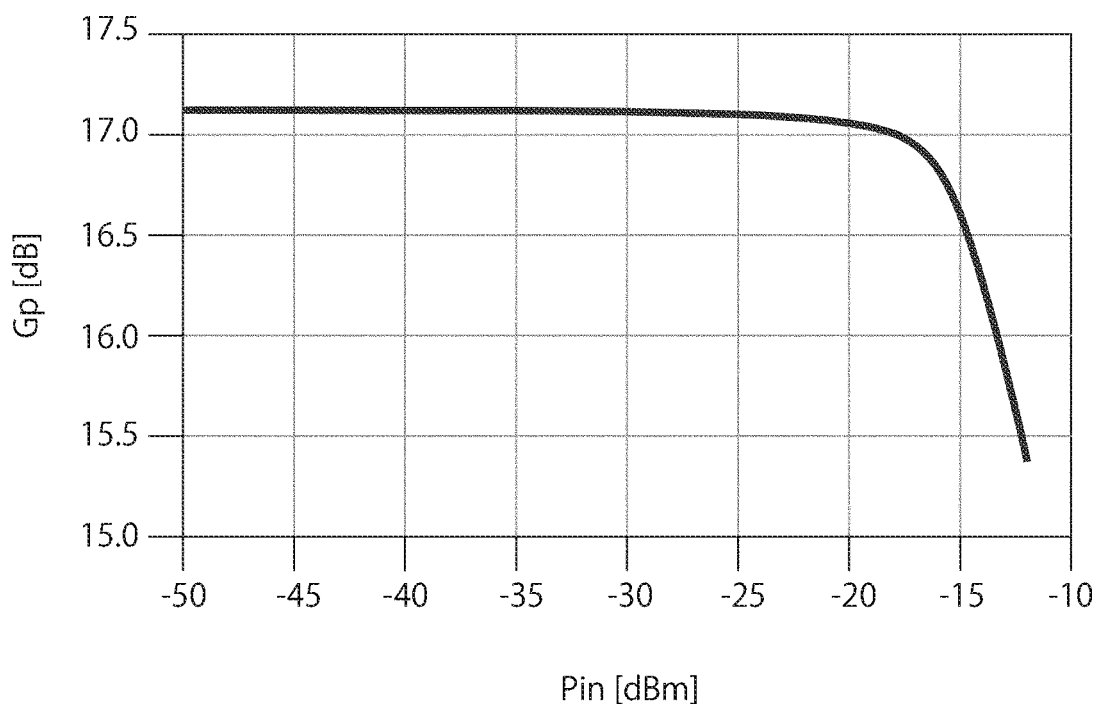

FIG. 27 is a chart illustrating the relationship between the power level of the input signal and the gain Gp in the split output mode. The IP1 dB found from this chart is −13.7 dBm which is an excellent value.

FIG. 28 is a graph summarizing the above results. The fcenter indicates the frequency at the middle of the band, namely, the result at m2 in the chart. The description of within band indicates the worst condition within the band.

As described above, also in this embodiment, the semiconductor device 1 exhibiting excellent performance can be realized. Setting is made, as in the above embodiment, to resonate the inductors L1a, L1b and the capacitor C1 in a desired frequency, thereby making it possible to improve the isolation performance between the output ports in the split output mode. Further, the improvement in performance in each parameter in this embodiment can be achieved by changing the number of MOSFETs each having a drain and a source between which the high-frequency signal passes between the input/output ports in the single output mode and the split output mode.

Element constants of circuit constituting elements are as indicated as follows.

TABLE 3

| FET name | Tox | Lg | Wg |
|---|---|---|---|
| MOSFET FET1 | 2.5 | 0.14 | 300 |
| MOSFETs FET21, FET22 | 2.5 | 0.14 | 300 |
| MOSFETs FET31, FET32 | 2.5 | 0.14 | 300 |
| FETs of Switches Sw1, Sw2, Sw31, Sw32, Sw33 | 5.5 | 0.21 | 500 |

Modified Example

Providing a distortion compensation unit in the above embodiment enables further improvement in IIP3 characteristics. In this modified example, an IIP3 compensation unit A1 is connected, as the distortion compensation unit in the single output mode, to the drain of the first MOSFET FET1, and IIP3 compensation units A21, A22 are connected, as the distortion compensation units in the split output mode, to the drain of the fourth MOSFET FET31 and the drain of the fifth MOSFET FET32.

The IIP3 compensation unit A1 among them may be connected to function only in the case of the single output mode and to be controlled by the Cont6 or the like.

Figure 30:
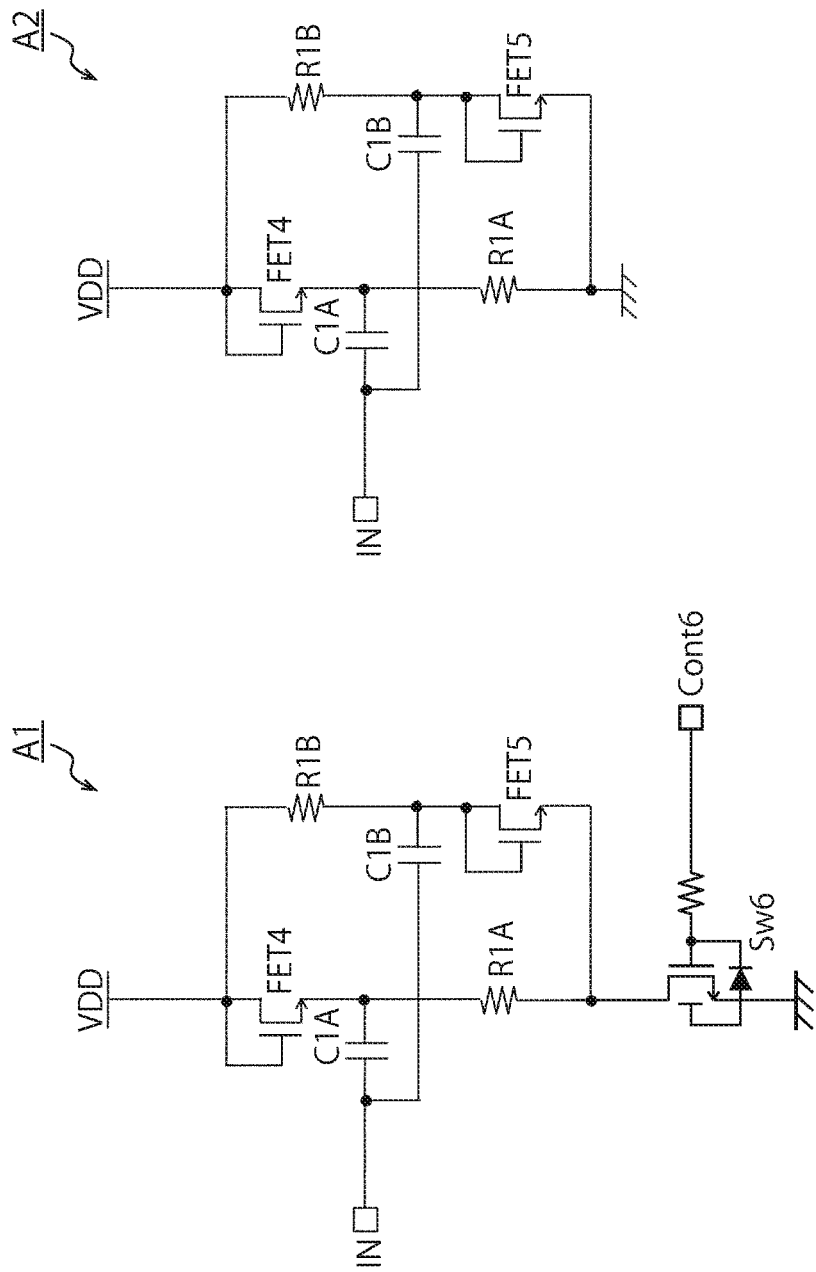
FIGS. 30A and 30B illustrate examples of an IIP3 compensation circuit in FIG. 29.

FIG. 30A is a diagram illustrating an example of the IIP3 compensation unit A1. As illustrated in FIG. 30A, the IIP3 compensation unit A1 is configured including n-type MOSFETs FET4, FET5, capacitors C1A, C1B, resistors R1A, R1B, and a switch Sw6.

Between VDD and GND, a series circuit of the MOSFET FET4 and the resistor R1A, and a series circuit of the resistor R1B and the MOSFET FET5 are installed in parallel. The gate and the drain of the MOSFET FET4 are connected, and the source of the MOSFET FET4 and the resistor R1A are connected in series. On the other hand, the gate and the drain of the MOSFET FET5 are connected, and the drain of the MOSFET FET5 and the resistor R1B are connected in series.

Figure 29:
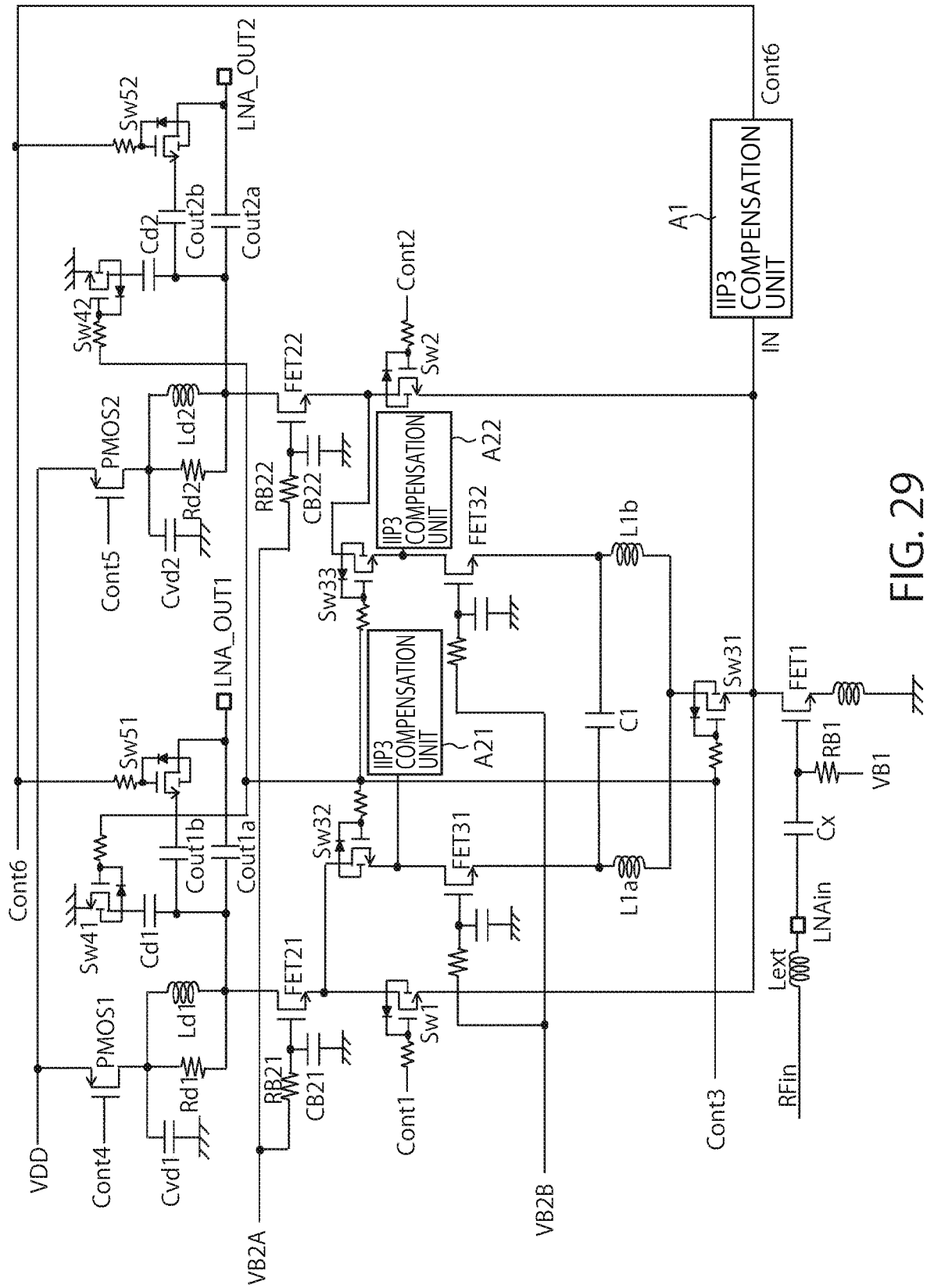
FIG. 29 is a circuit diagram of an LNA according to a modified example.

The capacitors C1A, C1B are installed in parallel to be connected between the MOSFET FETs and the resistors in the respective circuits from the input terminal. Each of the series circuits of the MOSFET FET and the resistor is connected to GND via the switch Sw6. IN and the Cout6 are terminals corresponding to IN and the Cont6 in FIG. 29.

When the switch Sw6 is turned on, these circuits are connected from VDD to GND, and therefore the IIP3 compensation unit A1 fulfills the function. More specifically, the IIP3 compensation unit A1 fulfills the function of the distortion compensation circuit when the switch Sw6 is ON, in this example, the Cont6 is High, namely, in the single output mode.

The IIP3 compensation unit includes the MOSFET FET4 and the MOSFET FET5 being nonlinear elements, and is a nonlinear circuit itself. Appropriately setting the constants of the elements can cancel the third order distortion generated in the LNA body.

Note that the switch Sw6 is connected, but not limited to, between GND and the parallel circuit. For example, it is also adoptable that the switch Sw6 is provided, for example, between IN and the capacitors CIA, C1B, and the distortion compensation circuit and the external circuit are connected only in the single output mode.

FIG. 30B is a diagram illustrating a circuit configuration of IIP3 compensation circuits A21, A22. This configuration is the same as that in FIG. 30A except that the switch in FIG. 30A is excluded.

Note that in FIG. 30A, FIG. 30B, VDD is connected, but not limited to, at all times. More specifically, a configuration in which the bias voltage is applied only in a necessary mode may be made. The circuit of the MOSFET FET4, the resistor R1A, and the capacitor CIA and the circuit of the MOSFET FET5, the resistor RIB, and the capacitor C1B are connected in symmetry but this is not essential, and a circuit composed of only one of them may be made. As illustrated in FIG. 30A and FIG. 30B, providing the two circuits in parallel enables suppression of even number-order distortion.

Hereinafter, simulation results of parameters and so on in the single output mode are illustrated. It is assumed that the bias current Idd is Idd=6.44 mA.

Figure 31:
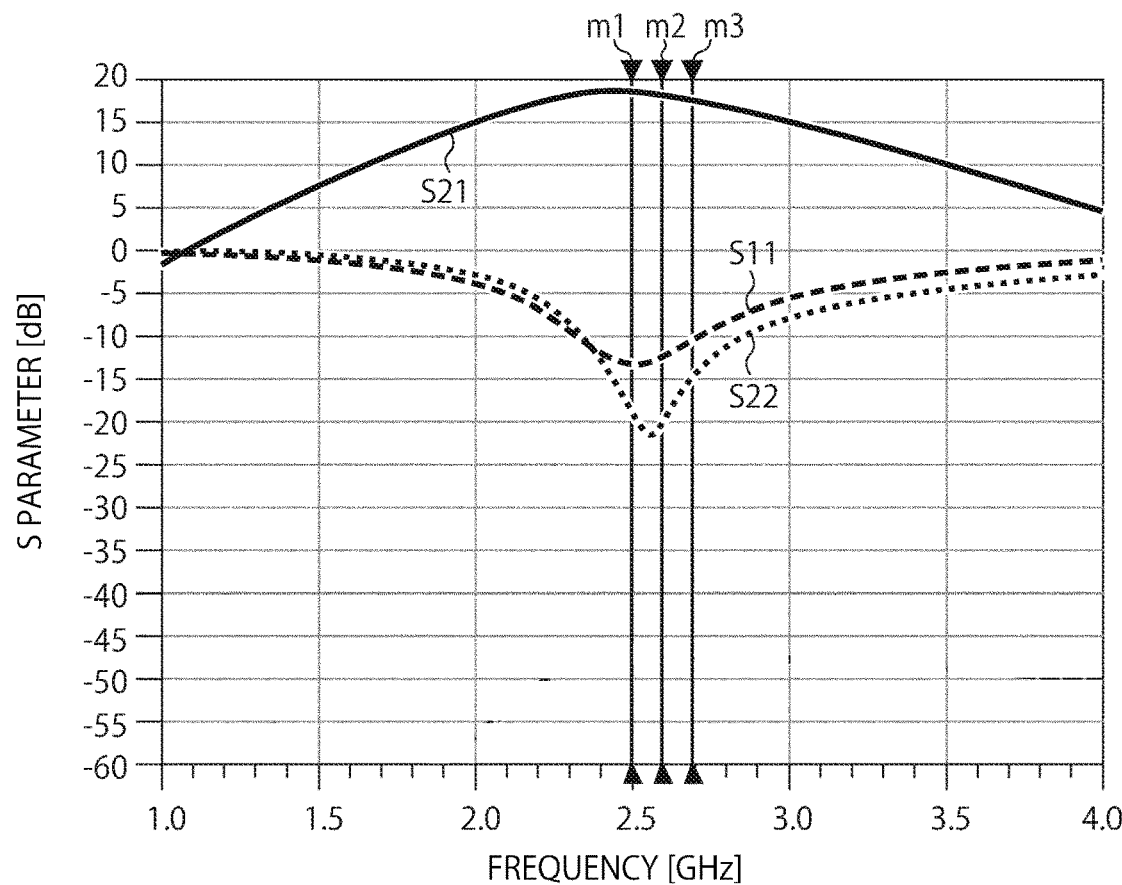

FIG. 31 is a chart illustrating the S parameter in the single output mode by the LNA using the semiconductor device 1 according to this modified example. S21, S11, S22 and m1, m2, m3 are the same as those in the above description of FIG. 11.

At m1, S21=18.5 dB, S11=−13.3 dB, and S22=−18.9 dB. At m2, S21=18.1 dB, S11=−12.3 dB, and S22=−20.1 dB. At m3, S21=17.6 dB, S11=−10.3 dB, and S22=−14.8 dB. As described above, in the focused frequency band, S21 becomes high, namely, is sufficiently amplified, whereas S11, S22 indicating the reflection characteristics are suppressed to be sufficiently low.

Figure 32:
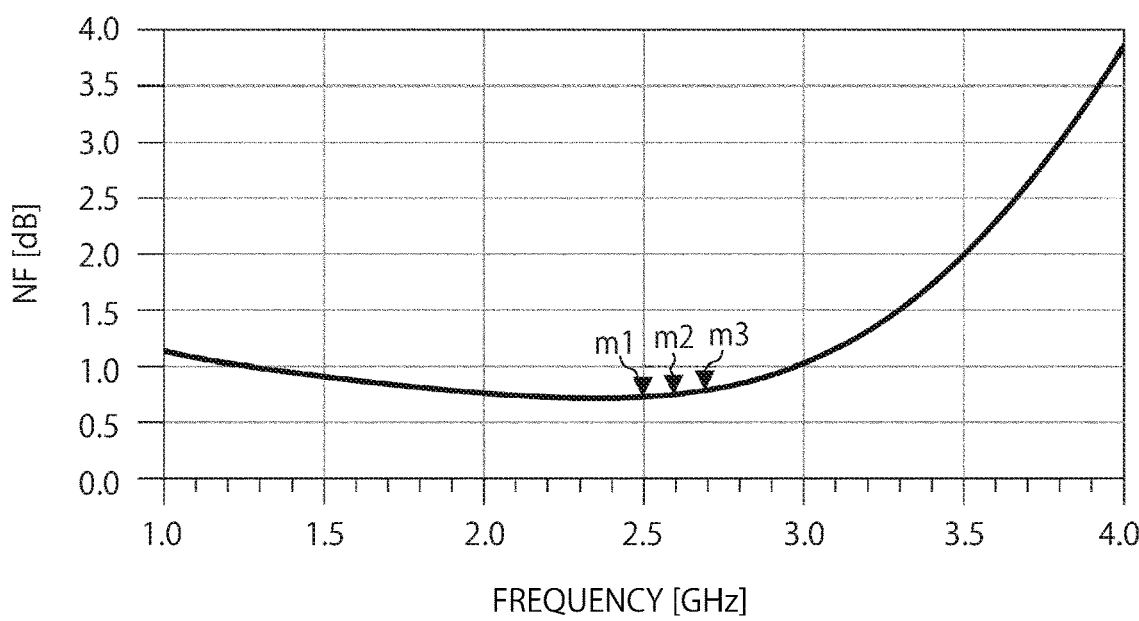

FIG. 32 is a chart illustrating the NF in the single output mode. M1 to m3 are the same as those in the description of FIG. 7. At m1, NF=0.73 dB, at m2, NF=0.75 dB, and at m3, NF=0.78 dB each of which is an excellent value of 0.78 dB or less.

Figure 33:
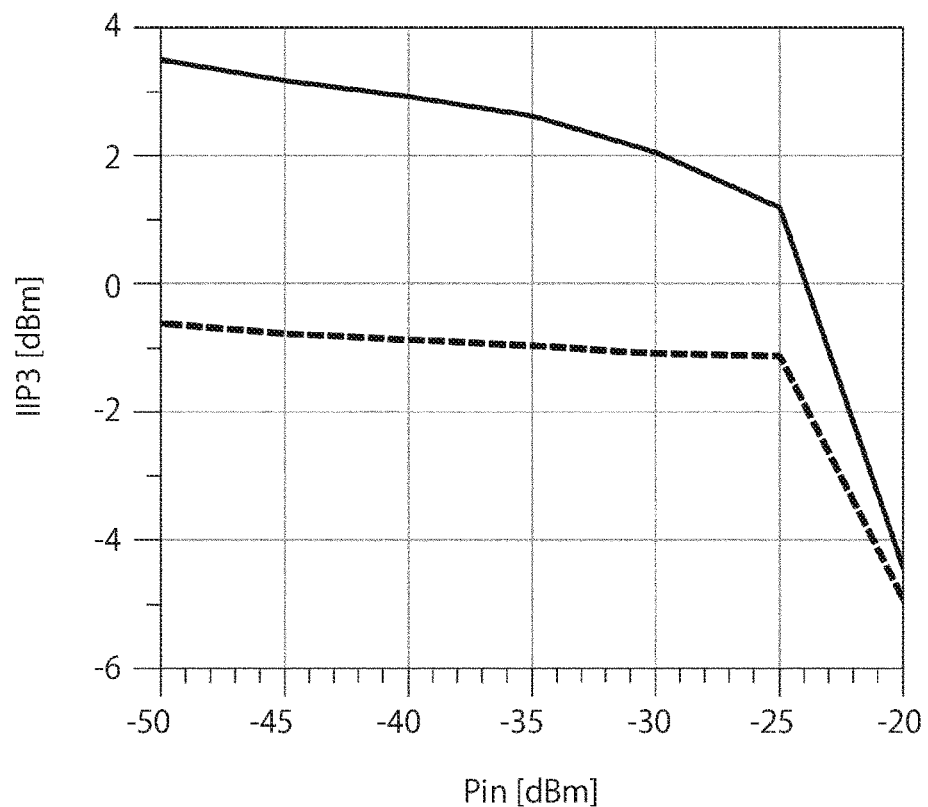

FIG. 33 is a chart illustrating the Pin dependence of IIP3 in the single output mode. The IIP3 at a power level of the input signal Pin=−30 dBm is 2.05 dBm which is an excellent value. The case of absence of the distortion compensation unit is indicated as a broken line as a comparative example, and the IIP3 characteristics greatly improve as compared with the case of absence of the distortion compensation unit.

Figure 34:
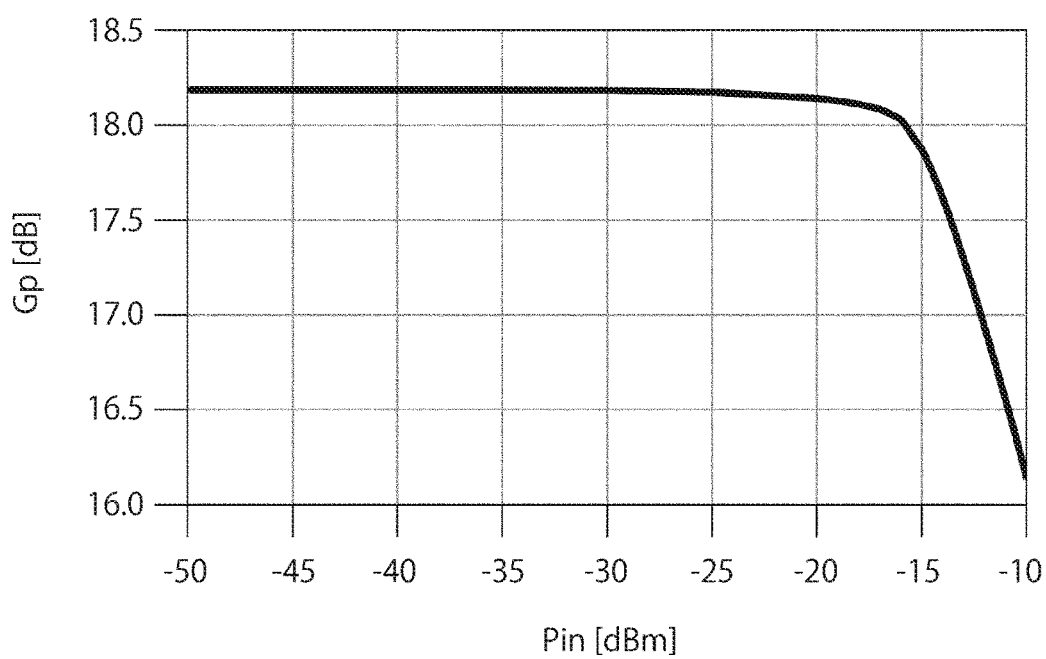

FIG. 34 is a chart illustrating the relationship between the power level of the input signal and the gain Gp in the single output mode. The IP1 dB found from this chart is −12.7 dBm which is an excellent value.

Next, simulation results of parameters and so on in the split output mode are illustrated. It is assumed that the bias current Idd is Idd=12.9 mA.

Figure 35:
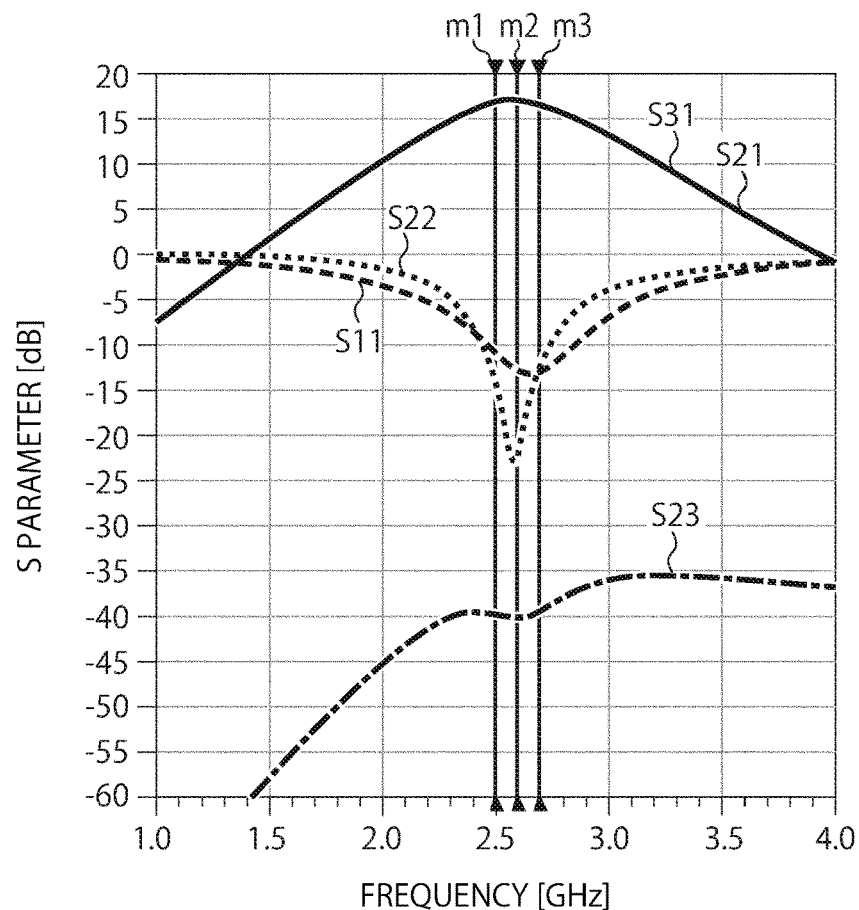

FIG. 35 is a chart illustrating the S parameter in the split output mode. S21, S11, S22, S23 and m1, m2, m3 are the same as those in the above description of FIG. 11. Further, transmission from the input port RFin to the output port LNA_OUT2 is illustrated as S31. Note that graphs of S21 and S31 are almost overlapped with each other in FIG. 35.

At m1, S21=17.0 dB, S31=17.0 dB, S11=−10.7 dB, S22=−13.9 dB, and S23=−39.8 dB. At m2, S21=17.1 dB, S31=17.1 dB, S11=−12.7 dB, S22=−22.4 dB, and S23=−40.2 dB. At m3, S21=16.7 dB, S31=16.7 dB, S11=−12.0 dB, S22=−12.4 dB, and S23=−39.4 dB. As described above, in the focused frequency band, S21, S31 become high, whereas S11, S22 are suppressed to be sufficiently low. Further, S23 is suppressed to a value sufficiently lower than −25 dB which is desired.

Figure 36:
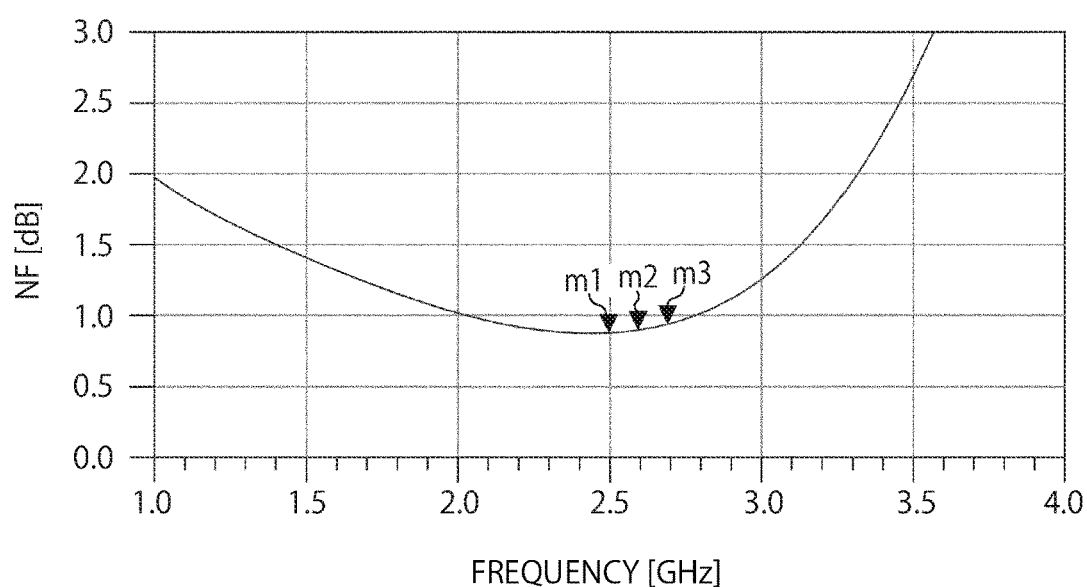

FIG. 36 is a chart illustrating the NF in the split output mode. M1 to m3 are the same as those in the description of FIG. 7. At m1, NF=0.88 dB, at m2, NF=0.90 dB, and at m3, NF=0.94 dB each of which is an excellent value of 0.94 dB or less.

Figure 37:
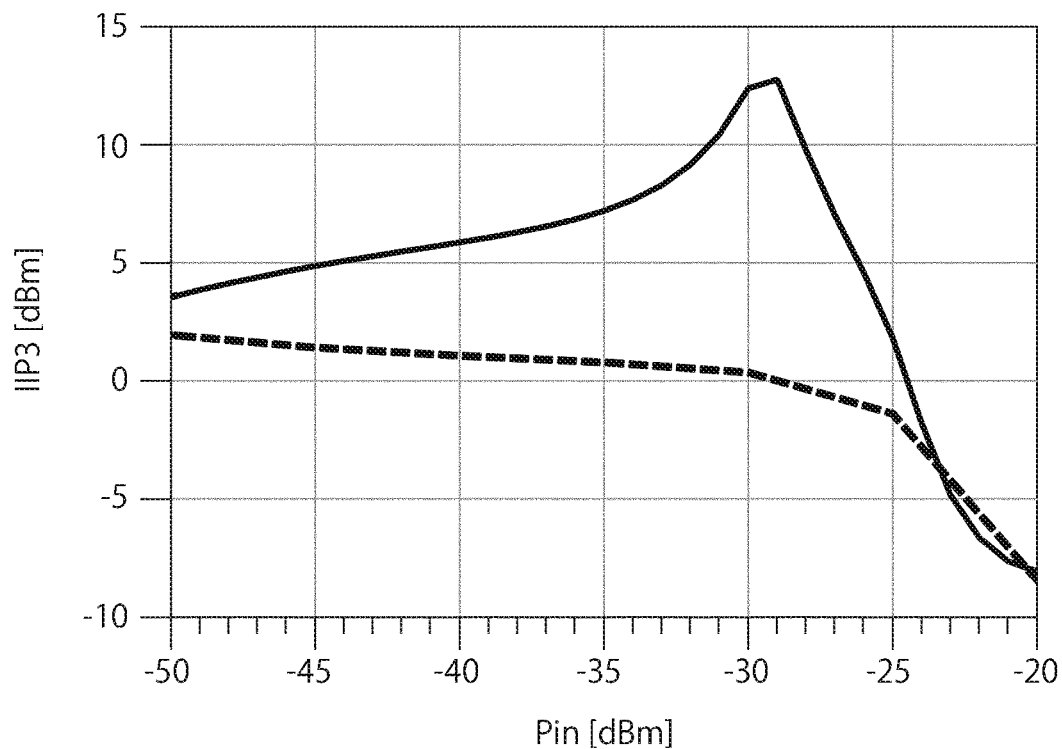

FIG. 37 is a chart illustrating the Pin dependence of IIP3 in the split output mode. The IIP3 at a power level of the input signal Pin=−30 dBm is 12.4 dBm which is an excellent value. In particular, the dependence of IIP3 at Pin=−30 dBa is better by 12 dBm or more than that in the comparative example (broken line) in the case of absence of the distortion compensation unit.

Figure 38:
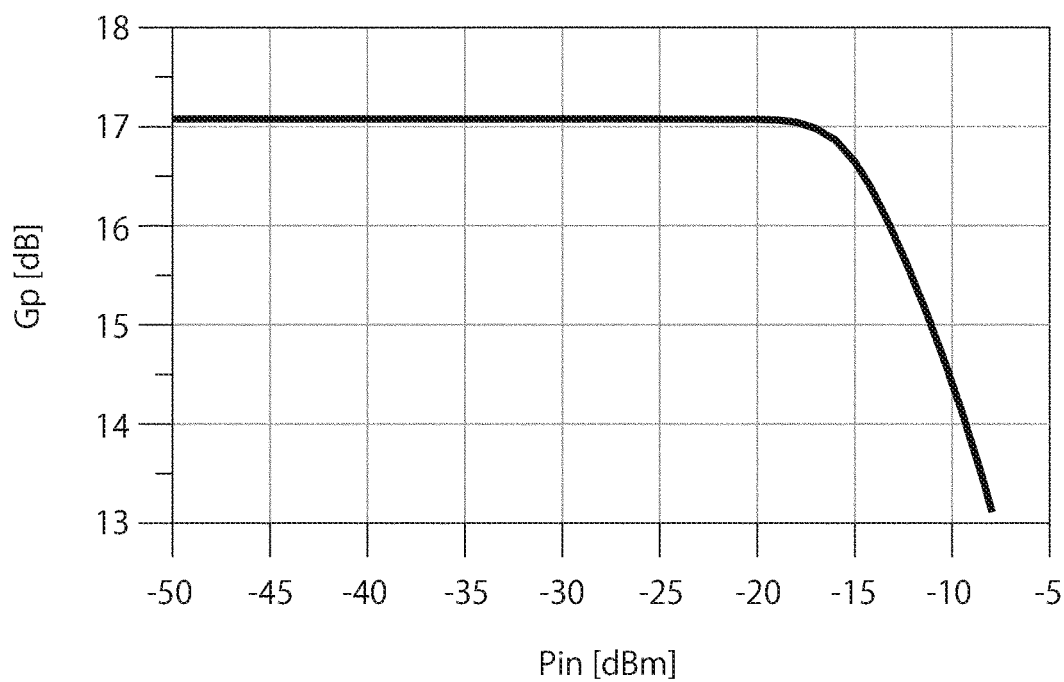

FIG. 38 is a chart illustrating the relationship between the power level of the input signal and the gain Gp in the split output mode. The IP1 dB found from this chart is −13.4 dBm which is an excellent value.

FIG. 39 is a graph summarizing the above results. The fcenter indicates the frequency at the middle of the band, namely, the result at m2 in the chart. The description of within band indicates the worst condition within the band.

As described above, according to this modified example, providing the distortion compensation unit enables further improvement in IIP3 characteristics.

Element constants of circuit configuration elements are as indicated as follows.

TABLE 4

| FET name | Tox | Lg | Wg |
|---|---|---|---|
| MOSFET FET1 | 2.5 | 0.14 | 300 |
| MOSFETs FET21, FET22 | 2.5 | 0.14 | 300 |
| FETs of Switches Sw1, Sw2, Sw31, Sw32, Sw33 | 5.5 | 0.21 | 500 |
| MOSFETs FET4, FET5 | 25 | 0.14 | 5 |

Third Embodiment

Figure 40:
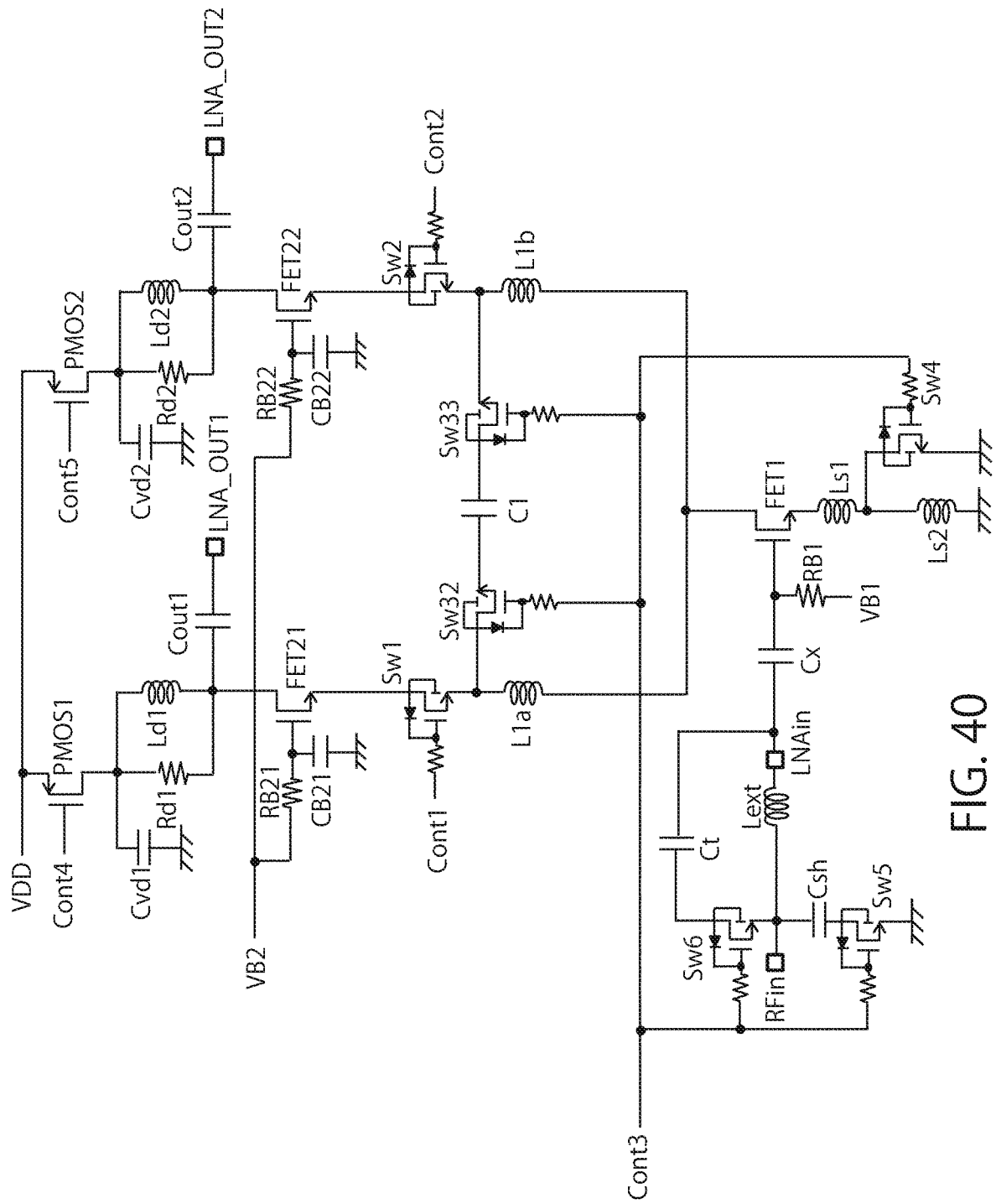
FIG. 40 is a circuit diagram of an LNA according to an embodiment.

FIG. 40 is a diagram illustrating a semiconductor device 1 according to a third embodiment. The semiconductor device 1 according to this embodiment is configured to control whether or not to explicitly activate an LC resonant circuit in a signal split region used in the single output mode and the split output mode, mainly, in the split output mode. Further, FIG. 41 is a table listing the voltages to be applied to the terminals in the single output mode and the split output mode. This is the same as FIG. 4 and detailed description is omitted.

Figure 42:
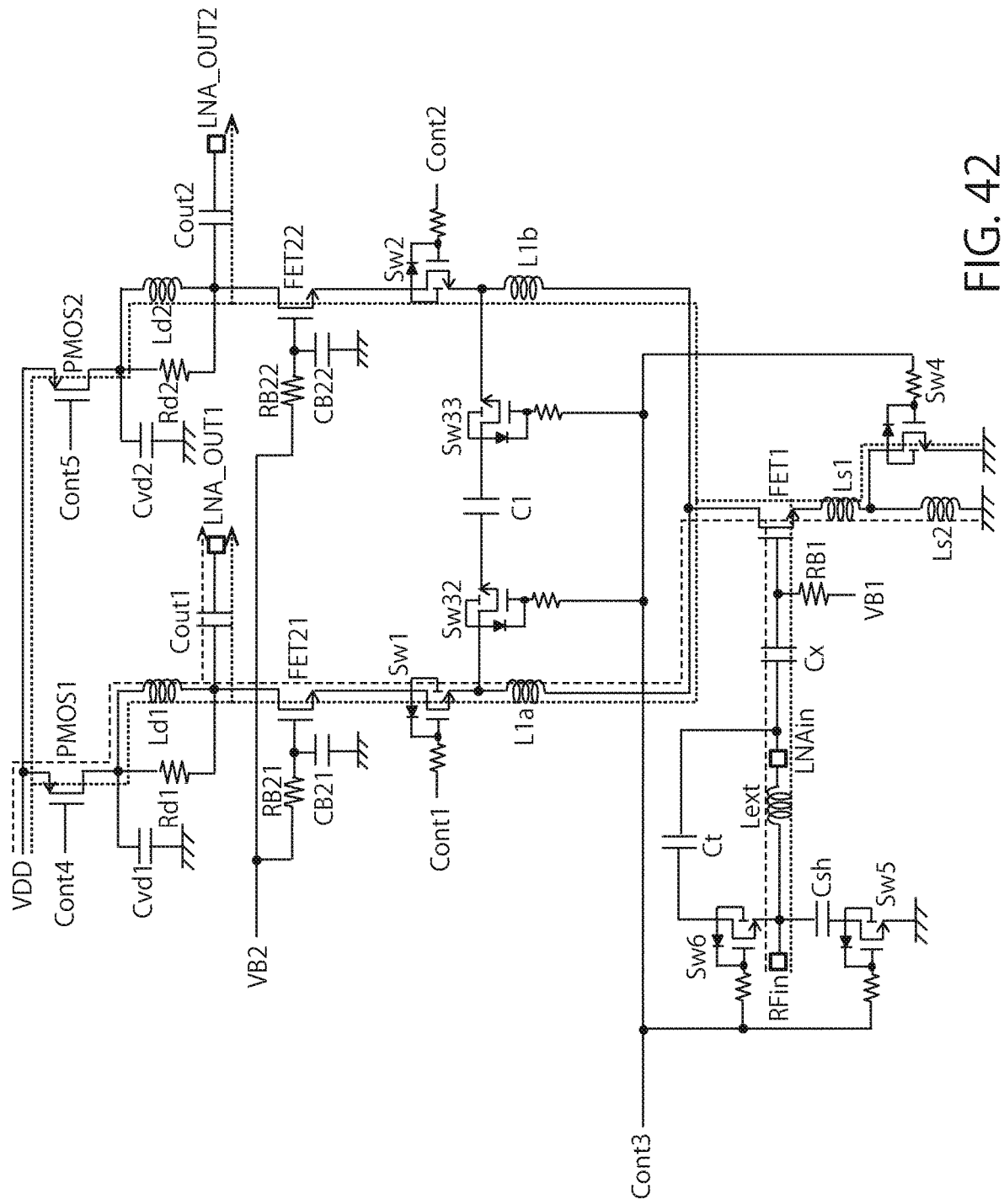

FIG. 42 is a diagram illustrating a path in the case of application of the voltages illustrated in FIG. 40. A path indicated with a broken line illustrates a path in the case of outputting the signal to the output port LNA_OUT1 in the single output mode, and a path indicated with a dotted line is a path in the case of outputting the signal to both the output ports LNA_OUT1, LNA_OUT2 in the split output mode.

As illustrated in the path, in the single output mode, the path does not pass through the capacitor C1 located between the inductor L1a and the inductor L1b by the functions of the fourth switch Sw31 and the fifth switch Sw32. For example, in the case of outputting the signal to the output port LNA_OUT1, the inputted signal follows the path not passing through the inductor L1b and the capacitor C1. On the other hand, in the split output mode, the capacitor C1 is activated by turning on the fourth switch Sw31 and the fifth switch Sw32, thereby forming a path of the parallel connection of the series connection of the inductors L1a, L1b and the capacitor C1 as in the above embodiment, and resonate here to achieve the improvement in isolation characteristics and the reduction of noise.

In this embodiment, the switch is controlled to make the resonant circuit not function in the single output mode and make the resonant circuit function in the split output mode as described above. Note that the circuits in FIG. 40, FIG. 42 are examples, and installing the switch Sw32 at the position of the capacitor C1 and installing two capacitors at the positions of the switches Sw31, Sw32 can obtain the same effect. Further, the switches Sw31, Sw32 are provided at both terminals of the capacitor C1 to secure symmetry, and may be provided at only one of the terminals.

Hereinafter, simulation results of parameters and so on in the single output mode are illustrated. It is assumed that the bias current Idd is Idd=6.00 mA.

Figure 43:
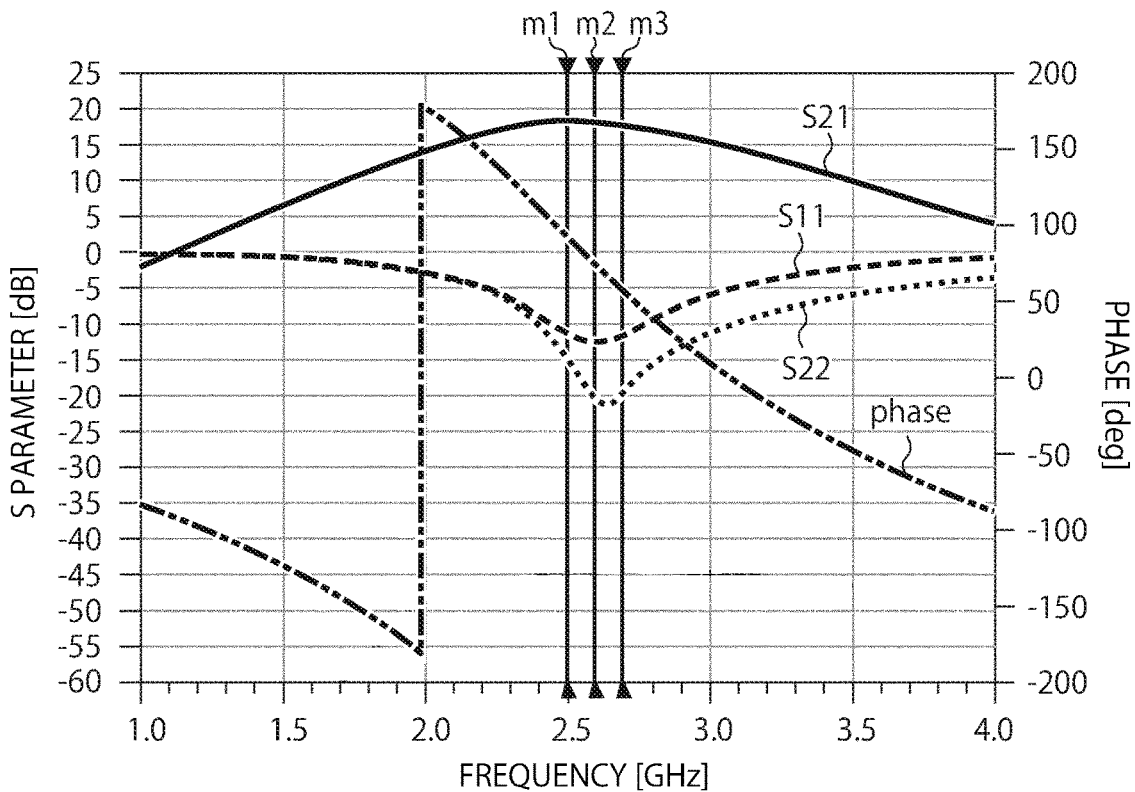

FIG. 43 is a chart illustrating the S parameter in the single output mode by the LNA using the semiconductor device 1 according to this embodiment. S21, S11, S22 and m1, m2, m3 are the same as those in the above description of FIG. 11. The phase is a graph indicating the phase of S21.

At m1, S21=18.2 dB, S11=−11.1 dB, S22=−14.6 dB, and phase=93.3. At m2, S21=18.1 dB, S11=−12.4 dB, and S22=−20.1 dB, and phase=75.2. At m3, S21=17.7 dB, S11=−11.4 dB, S22=−19.8 dB, and phase=58.0. As described above, in the focused frequency band, S21 becomes high, namely, is sufficiently amplified, whereas S11, S22 indicating reflection characteristics are suppressed to be sufficiently low.

Figure 44:
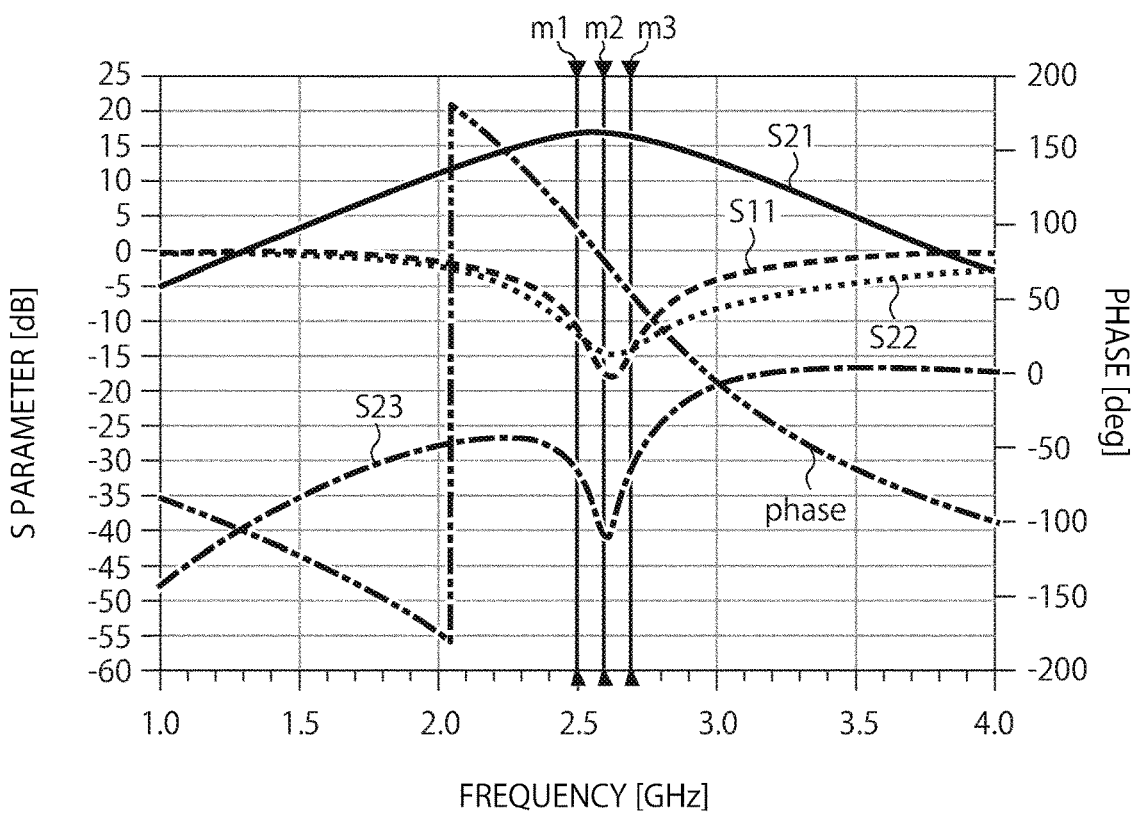

FIG. 44 is a chart illustrating the S parameter in the split output mode. S21, S11, S22, S23 and m1, m2, m3 are the same as those in the above description of FIG. 11. Further, transmission from the input port RFin to the output port LNA_OUT2 is illustrated as S31. Note that graphs of S21 and S31 are almost overlapped with each other in FIG. 44. The phase is a graph indicating the phase of S21 as in FIG. 43. The bias current Idd is set to Idd=13.9 mA.

At m1, S21=17.0 dB, S31=17.0 dB, S11=−10.6 dB, S22=−11.5 dB, S23=−31.4 dB, and phase=96.8. At m2, S21=17.1 dB, S31=17.1 dB, S11=−17.2 dB, S22=−14.5 dB, S23=−40.4 dB, and phase=74.6. At m3, S21=16.6 dB, S31=16.6 dB, S11=−14.4 dB, S22=−14.0 dB, S23=−31.3 dB, and phase=52.8. As described above, in the focused frequency band, S21, S31 become high, whereas S11, S22 are suppressed to be sufficiently low. Further, S23 is suppressed to a value sufficiently lower than −25 dB which is desired.

FIG. 45 is a table listing the phases in the single output mode and the split output mode. In the focused frequency band, the phase discontinuity between the single output mode and the split output mode falls within 5.2 deg.

As described above, also in this embodiment, the semiconductor device 1 exhibiting excellent performance can be realized. Setting is made, as in the above embodiment, to resonate the inductors L1a, L1b and the capacitor C1 in a desired frequency band, thereby making it possible to improve the isolation performance between the output ports in the split output mode. Further, the semiconductor device 1 according to this embodiment can keep the phase discontinuity between the output modes to be low, and therefore is applicable also in the case where the requirement of the phase deviation between the output mods is severe.

Element constants of circuit configuration elements are as indicated as follows.

TABLE 5

| FET name | Tox | Lg | Wg |
| --- | --- | --- | --- |
| MOSFET FET1 | 2.5 | 0.14 | 300 |
| MOSFETs FET21, FET22 | 5.5 | 0.21 | 300 |
| FETs of Switches Sw1, Sw2 | 5.5 | 0.21 | 500 |

Modified Example

The isolation characteristics are improved by controlling whether or not to activate the capacitor C1 in the output mode in the above embodiment, and a circuit for adjusting input/output is further included in this modified example.

Figure 46:
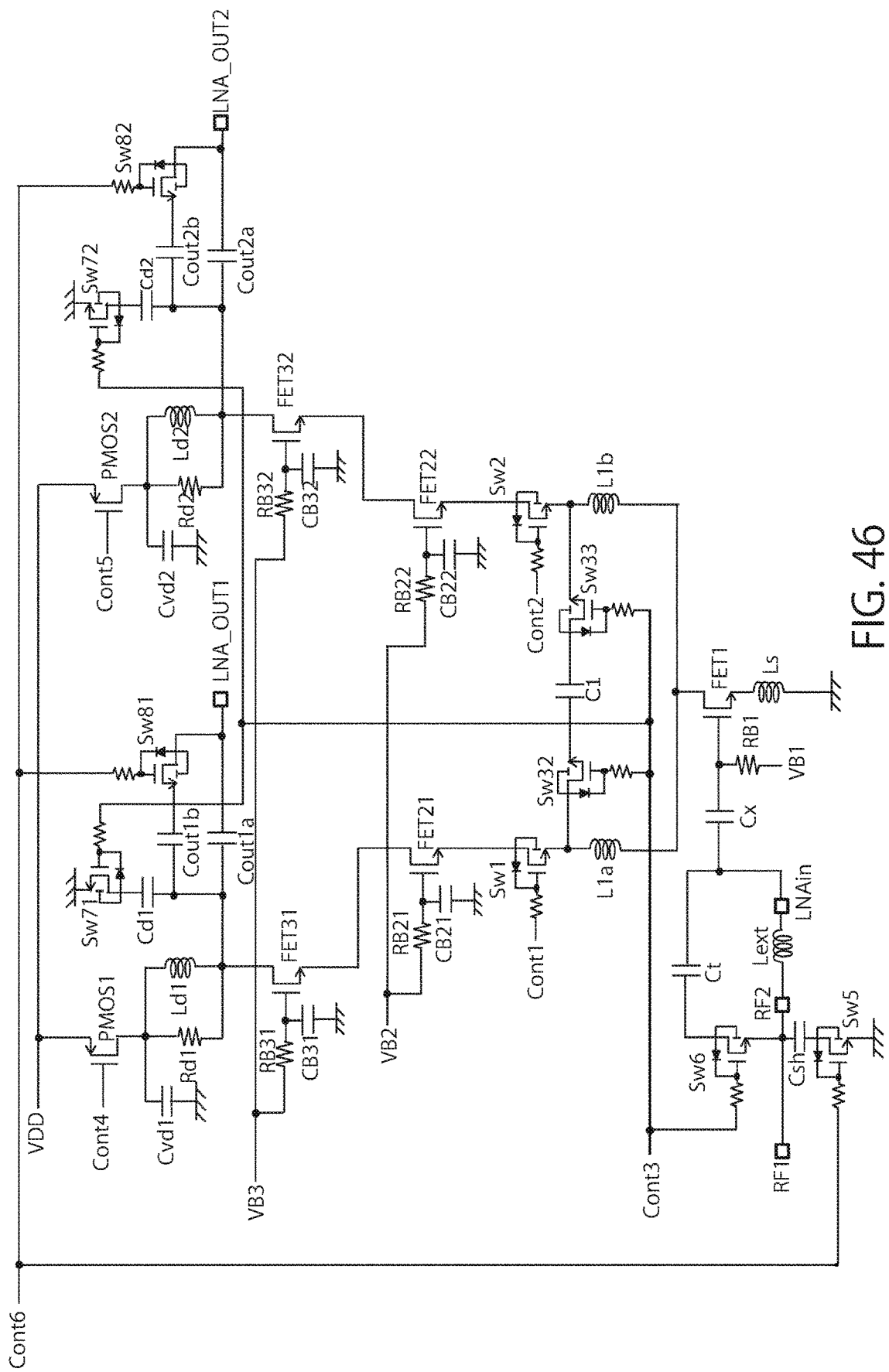
FIG. 46 is a circuit diagram of an LNA according to a modified example.

FIG. 46 is a circuit diagram illustrating a semiconductor device 1 according to this modified example.

On the input side of the circuit in the above third embodiment, exclusively turning on/off the switch Sw5 and the switch Sw6 controls the adjusting circuit on the input side. Further, an adjusting circuit on the output side including switches Sw71, Sw81, capacitors Cd1, Cout1b to be connected to the output port LNA_OUT1. Similarly, an adjusting circuit including switches Sw72, Sw82, capacitors Cd2, Cout2b for the output port LNA_OUT2. These adjusting circuits for output are the same as those in the second embodiment, and therefore detailed description thereof is omitted.

Further, in this modified example, a fourth MOSFET FET31 is provided between the drain of the second MOSFET FET21 and the circuit on the output side of the output port LNA_OUT1, and a fifth MOSFET FET32 is provided between the drain of the third MOSFET FET22 and the circuit on the output side of the output port LNA_OUT2.

FIG. 47 is a table listing the control states of the voltages to be applied to the terminals according to this modified example. Note that it is assumed that VDD=1.8 V. Further, High in Cont1, Cont2, Cont3, and Cont6 is, for example, 3 V, and Low is, for example, −2V.

In each mode, the Cont1 to the Cont6 are controlled as listed in the table. This is the same control as in each of the above embodiments and modified examples, and therefore detailed description thereof is omitted.

Further, in this modified example, the bias voltages VB1, VB2, VB3 are controlled as listed in the table. VB1, VB2, VB3 are controlled so that the second MOSFET FET21 and the third MOSFET FET22 operate in a linear region in the single output mode and the second MOSFET FET21, the third MOSFET FET22, the fourth MOSFET FET31, and the fifth MOSFET FET32 operate in a saturation region in the split output mode. To satisfy the above states, the bias voltages are controlled to be V1$a$<V1$b$<V2$b$<V3$b$ as listed in the table.

Figure 48:
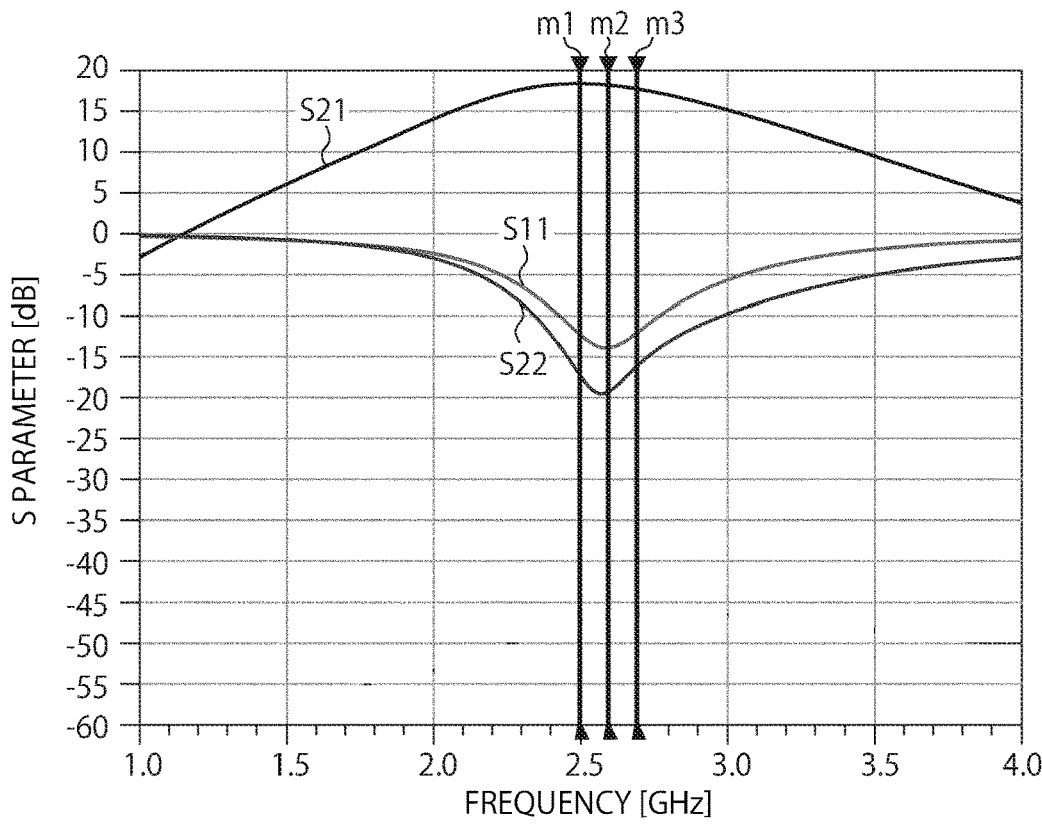
FIG. 48, FIG. 49 illustrate data regarding the output of the circuit in FIG. 46.

FIG. 48 is a chart illustrating the S parameter in the single output mode by the LNA using the semiconductor device 1 according to this embodiment. S21, S11, S22 and m1, m2, m3 are the same as those in the above description of FIG. 11. It is assumed that the bias current is set to Idd=5.0 mA.

At m1, S21=18.44 dB, S11=−12.3 dB, and S22=−17.3 dB. At m2, S21=18.2 dB, S11=−13.9 dB, and S22=−19.3 dB. At m3, S21=17.7 dB, S11=−12.1 dB, and S22=−16.2 dB. As described above, in the focused frequency band, S21 becomes high, namely, is sufficiently amplified, whereas S11, S22 indicating reflection characteristics are suppressed to be sufficiently low.

Figure 49:
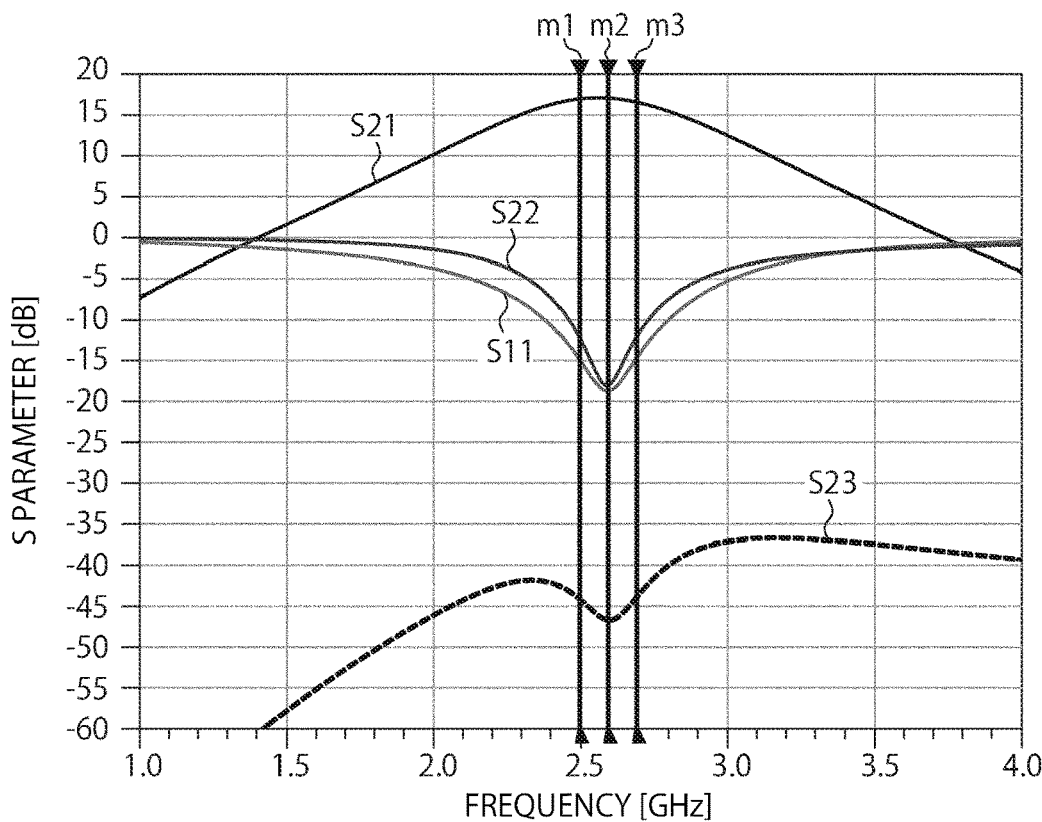

FIG. 49 is a chart illustrating the S parameter in the split output mode. S21, S11, S22, S23 and m1, m2, m3 are the same as those in the above description of FIG. 11. Further, transmission from the input port RFin to the output port LNA_OUT2 is indicated as S31. Note that graphs of S21 and S31 are almost overlapped with each other in FIG. 49. The bias current is set to Idd=13.5 mA.

At m1, S21=17.0 dB, S11=−14.9 dB, S22=−12.3 dB, and S23=−44.2 dB. At m2, S21=17.1 dB, S11=−18.7 dB, S22=−18.0 dB, and S23=−46.7 dB. At m3, S21=16.6 dB, S11=−14.7 dB, S22=−12.1 dB, and S23=−43.9 dB. As described above, in the focused frequency band, S21, S31 become high, whereas S11, S22 are suppressed to be sufficiently low. Further, S23 is suppressed to a value sufficiently lower than −25 dB which is desired.

As described above, also in this modified example, the semiconductor device 1 exhibiting excellent performance can be realized. Setting is made, as in the above embodiment, to resonate the inductors L1$a$, L1$b$ and the capacitor C1 in a desired frequency band, thereby making it possible to improve the isolation performance between the output ports in the split output mode. Further, according to this modified example, more finely controlling the gate voltage of the MOSFET of each type according to each more enables further improvement in the isolation performance.

Element constants of circuit constituting elements are as indicated as follows.

TABLE 6

| FET name | Tox | Lg | Wg |
|---|---|---|---|
| MOSFET FET1 | 2.5 | 0.14 | 300 |
| MOSFETs FET21, FET22 | 5.5 | 0.21 | 300 |
| MOSFETs FET31, FET32 | 5.5 | 0.21 | 300 |
| FETs of Switches Sw1, Sw2 | 5.5 | 0.21 | 500 |

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

For example, in all of the above embodiments and modified examples, the n-type MOSFET may be a p-type MOSFET according to the situation. Further, as the MOSFET, another transistor having the same function such as a bipolar transistor which functions as a switching element by voltage, current, or another external switching signal, may be used. For example, in the case of using the bipolar transistor, the gate, source, drain in the explanation in this description and claims can be replaced in reading with an appropriate combination of a base, collector (emitter), emitter (collector). In any replacement in reading, the physical amounts used for switching such as the magnitude of the voltage to be applied to the gate or the current to be applied to the base can be appropriately replaced in reading so as to perform the equivalent operation to that having the above-described functions by the characteristics of the elements.

The invention claimed is:

1. A semiconductor device comprising:
   a first transistor having a gate into which a high-frequency signal is inputted;
   a first switch, a second switch, and a third switch each of which has one terminal connected in series with a drain of the first transistor and which are connected in parallel;
   a second transistor having a source connected to another terminal of the first switch and a gate at which a high-frequency component is grounded;
   a third transistor having a source connected to another terminal of the second switch and a gate at which a high-frequency component is grounded;
   a first inductor and a second inductor each of which has one terminal connected in series with another terminal of the third switch and which are connected in parallel;
   a fourth switch having one terminal connected to another terminal of the first inductor and another terminal connected to the source of the second transistor;
   a fifth switch having one terminal connected to another terminal of the second inductor and another terminal connected to the source of the third transistor; and
   a capacitor connected between the one terminal of the fourth switch and the one terminal of the fifth switch, wherein
   when the high-frequency signal is inputted, a signal amplified with low noise is outputted from at least one of a first port connected to a drain of the second transistor and a second port connected to a drain of the third transistor.

2. The semiconductor device according to claim 1, wherein
   a gate length of the first transistor is shorter than a gate length of the second transistor and a gate length of the third transistor, and a gate oxide film thickness of the first transistor is smaller than a gate oxide film thickness of the second transistor and a gate oxide film thickness of the third transistor.

3. The semiconductor device according to claim 1, wherein
   a potential to be applied to the gate of the first transistor is controlled to be higher in the case of outputting the inputted high-frequency signal from both the first port and the second port than in the case of outputting the inputted high-frequency signal from one of the first port and the second port.

4. The semiconductor device according to claim 1, wherein
an inductance connected to a source of the first transistor is controlled to be smaller in the case of outputting the inputted high-frequency signal from both the first port and the second port than in the case of outputting the inputted high-frequency signal from one of the first port and the second port.

5. The semiconductor device according to claim 1, wherein
a gate capacitor connected to the gate of the first transistor and an external inductor connected to the gate capacitor outside the semiconductor device are connected, and the inputted high-frequency signal is inputted via the gate capacitor and the external inductor to the gate of the first transistor.

6. The semiconductor device according to claim 5, in the case of outputting the inputted high-frequency signal from both the first port and the second port, further comprising:
an input-side resonant capacitor in parallel with the external inductor; and
an input-side grounded capacitor between the external inductor and a ground potential on a side of the external inductor into which the high-frequency signal is inputted.

7. A semiconductor device comprising:
a first transistor (FET1) having a gate into which a high-frequency signal is inputted;
a first switch, a second switch, and a third switch each of which has one terminal connected in series with a drain of the first transistor and which are connected in parallel;
a second transistor having a source connected to another terminal of the first switch and a gate at which a high-frequency component is grounded;
a third transistor having a source connected to another terminal of the second switch and a gate at which a high-frequency component is grounded;
a first inductor and a second inductor each of which has one terminal connected in series with another terminal of the third switch and which are connected in parallel;
a fourth transistor having a source connected to another terminal of the first inductor and a gate at which a high-frequency component is grounded;
a fifth transistor having a source connected to another terminal of the second inductor and a gate at which a high-frequency component is grounded;
a fourth switch having one terminal connected to a drain of the fourth transistor and another terminal connected to the source of the second transistor;
a fifth switch having one terminal connected to a drain of the fifth transistor and another terminal connected to the source of the third transistor; and
a capacitor connected between the source of the fourth transistor and the source of the fifth transistor, wherein
when the high-frequency signal is inputted, a signal amplified with low noise is outputted from at least one of a first port connected to a drain of the second transistor and a second port connected to a drain of the third transistor.

8. The semiconductor device according to claim 7, further comprising:
a distortion compensation circuit connected to each of the drain of the fourth transistor, the drain of the fifth transistor, and the drain of the first transistor.

9. The semiconductor device according to claim 7, wherein
a potential to be applied to the gate of the first transistor is controlled to be higher in the case of outputting the inputted high-frequency signal from both the first port and the second port than in the case of outputting the inputted high-frequency signal from one of the first port and the second port.

10. The semiconductor device according to claim 7, wherein
a potential to be applied to the gates of the second transistor and the third transistor is controlled to be higher in the case of outputting the inputted high-frequency signal from both the first port and the second port than in the case of outputting the inputted high-frequency signal from one of the first port and the second port.

11. A semiconductor device comprising:
a first transistor having a gate into which a high-frequency signal is inputted;
a first switch and a second switch each of which has one terminal connected in series with a drain of the first transistor and which are connected in parallel;
a second transistor having a source connected to another terminal of the first switch and a gate at which a high-frequency component is grounded;
a third transistor having a source connected to another terminal of the second switch and a gate at which a high-frequency component is grounded;
a first inductor and a second inductor each of which has one terminal connected in series with the drain of the first transistor and which are connected in parallel;
a third switch having one terminal connected to another terminal of the first inductor;
a fourth switch having one terminal connected to another terminal of the second inductor; and
a capacitor connected between another terminal of the third switch and another terminal of the fourth switch, wherein
when the high-frequency signal is inputted, a signal amplified with low noise is outputted from at least one of a first port connected to a drain of the second transistor and a second port connected to a drain of the third transistor.

12. The semiconductor device according to claim 11, wherein:
in a case of outputting the inputted high-frequency signal from the first port connected to the second transistor, the first switch is turned on, and
the second switch, the third switch and the fourth switch are turned off;
in a case of outputting the inputted hi-frequency signal from the second port connected to the third transistor, the second switch is turned on, and
the first switch, the third switch and the fourth switch are turned off; and
in a case of outputting the inputted high-frequency signal from both the first port and the second port,
the first switch and the second switch are turned off, and
the third switch and the fourth switch are turned on.

13. The semiconductor device according to claim 11, further comprising;
a fourth transistor having a source connected to the drain of the second transistor; and
a fifth transistor having a source connected to the drain of the third transistor.

14. The semiconductor device according to claim 13, wherein:

in the case of outputting the inputted high-frequency signal from one of the first port and the second port, the second transistor and the third transistor operate in a linear region; and in the case of outputting the inputted high-frequency signal from both the first port and the second port, the second transistor, the third transistor, the fourth transistor, and the fifth transistor operate in a saturation region.

15. The semiconductor device according to claim 11, wherein
a potential to be applied to the gate of the first transistor is controlled to be higher in the case of outputting the inputted high-frequency signal from both the first port and the second port than in the case of outputting the inputted high-frequency signal from one of the first port and the second port.

16. The semiconductor device according to claim 11, wherein
an inductance connected to the source of the first transistor is controlled to be smaller in the case of outputting the inputted high-frequency signal from both the first port and the second port than in the case of outputting the inputted high-frequency signal from one of the first port and the second port.

17. The semiconductor device according to claim 11, wherein
a gate capacitor connected to the gate of the first transistor and an external inductor connected to the gate capacitor outside the semiconductor device are connected, and the inputted high-frequency signal is inputted via the gate capacitor and the external inductor to the gate of the first transistor.

18. The semiconductor device according to claim 17, in the case of outputting the inputted high-frequency signal from both the first port and the second port, further comprising:
an input-side resonant capacitor in parallel with the external inductor; and
an input-side grounded capacitor between the external inductor and a ground potential on a side of the external inductor into which the high-frequency signal is inputted.

* * * * *